(12) United States Patent
Yasufuku et al.

(10) Patent No.: US 6,439,919 B1
(45) Date of Patent: Aug. 27, 2002

(54) CAP AND LOW INSERTION FORCE CONNECTOR FOR PRINTED CIRCUIT BOARD

(75) Inventors: Kaori Yasufuku; Taiji Hosaka, both of Yokohama; Masaaki Miyazawa, Kawasaki, all of (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 09/643,963

(22) Filed: Aug. 23, 2000

(30) Foreign Application Priority Data

Dec. 28, 1999 (JP) .......................................... 11-375734

(51) Int. Cl.[7] .............................................. H01R 13/64
(52) U.S. Cl. .......................................... 439/377; 439/55
(58) Field of Search ........................... 439/377, 55, 59, 439/636, 637, 135, 60

(56) References Cited

U.S. PATENT DOCUMENTS 4,298,237 A * 11/1981 Griffith et al. ............... 439/636
4,806,103 A * 2/1989 Kniese et al. .................. 439/60

FOREIGN PATENT DOCUMENTS

| TW | 313352 | 8/1997 |
| TW | 11-375734 | 12/1999 |

OTHER PUBLICATIONS

Inventors: Kaori Yasufuku et al., "Connector for Module", Filed: Aug. 23, 2000, Specification & Drawings of US Patent Application No. 09/643,948.

Inventors: Kaori Yasufuku et al., "Connector for Module", Issued: Aug. 21, 2001, US Patent Ser. No. 6,278,610.

* cited by examiner

Primary Examiner—P. Austin Bradley
Assistant Examiner—Ross Gushi
(74) Attorney, Agent, or Firm—Nixon Peabody LLP; Donald R. Studebaker

(57) ABSTRACT

A cap that is to be fitted to a printed circuit board, which has a conductive pad on the front side of the rectangular board thereof and which is to be connected to the connector. The cap is formed into a bag and is shaped into a wedge that gets thinner towards the front, and the cap has a window for exposing the conductive pad of the printed circuit board.

A low insertion force connector that connects a printed circuit board having conductive pads on the front side of the rectangular board thereof. This low insertion force connector comprises a connector body having at least a pair of contacts that contact the conductive pads and clamp the printed circuit board, a slider that carries the printed circuit board and advances to and retreats from the contact, and a guide that is provided at the front end of the slider and is formed into a wedge-shape, which gets thinner towards the front.

The present invention reduces the insertion force of the printed circuit board, enhances the connection workability, and eliminates damages or the like to the contacts and the conductive pad to enhance the reliability. The present invention provides a connector that is also effective in countermeasures against heat and electromagnetic waves.

8 Claims, 29 Drawing Sheets

CAP AND LOW INSERTION FORCE CONNECTOR FOR PRINTED CIRCUIT BOARD

BACKGROUND OF THE INVENTION

1. Field of the Invention

The present invention belongs to the technical field of a printed circuit board that has conductive pads on the front side of a rectangular board and a connector that connects this printed circuit board. In particular, the present invention relates to measures or the like for improving the workability of connecting the printed circuit board to the connector.

2. Related Art

Printed circuit boards of this kind include, for example, those in which semiconductor chips such as semiconductor memories are mounted on rectangular board. A connector is used extensively, which connects a printed circuit board of this kind to a printed circuit board such as a mother board (hereinafter referred to as the counterpart board) in a position wherein the two boards are approximately parallel to each other. This connector has an approximately U-shaped form to correspond to the front side, left side and right side of the printed circuit board. A groove is formed in this connector to receive the front side of the printed circuit board. Plural contacts, which contact the conductive pads of the printed circuit board and clamp the printed circuit board, are provided in this groove. The connector has arms that extend backward to correspond to the left side and the right side of the printed circuit board. The top ends of these arms can undergo elastic deformation leftward and rightward, respectively, and each arm is provided with a engaging claw on the inner side of the top end thereof. This connector is mounted on the counterpart board by soldering the solder tails of the contacts onto the counterpart board. When the printed circuit board is to be fitted into the connector, first, the printed circuit board is set in the insertion/withdrawal position in which the rear end of the printed circuit board is lifted more in comparison with its level in the connection position, and the front side of the printed circuit board is inserted between the contacts. Next, the rear side of the printed circuit board is pushed downward. The conductive pads of the printed circuit board and the contacts will contact with each other. Moreover, the top ends of the arms will be pushed away outward, and the printed circuit board will slip under the engaging claws. The engaging claws returning to their respective initial positions will engage the left side and the right side of the printed circuit board. This will retain the printed circuit board in the connection position. When the fitted printed circuit board is to be disconnected from the connector, the top ends of the arms are made by fingers to undergo elastic deformation outward so as to disengage the engaging claws from the printed circuit board. Then the rear side of the printed circuit board will be lifted by the elastic restoring forces of the contacts and the printed circuit board will be shifted from the connection position to the insertion/withdrawal position. Thus the printed circuit board can be withdrawn from the space between the contacts.

There is a tendency, for the above-mentioned conventional connector, to set a high contact force between the conductive pads of the printed circuit board and the contacts so as to prevent defective contact or the like. As a result, a large force is needed to insert the printed circuit board into the contacts and this greatly reduces the connection workability. The increase in the number of the contacts aggravates the problem. The edges of the printed circuit board may damage the plated layers of the contacts or deform the contacts; such damages may lower the reliability of the connector. Furthermore, the conductive pads may be damaged. Such problems are common to any printed circuit boards that are to be inserted into the connector, irrespective of whether semiconductor memories are mounted on the boards or not.

SUMMARY OF THE INVENTION

One object of the present invention is to reduce the insertion force of the printed circuit board and improve the connection workability, and to eliminate any damages or the like to the contact and the conductive pad and enhance the reliability of the connector by providing a wedge-shaped auxiliary member for smoothly guiding the contacting surfaces of the contact onto the conductive pad of the printed circuit board.

On the other hand, semiconductor memories show a tendency to increase their heat generation significantly. It is due to, for example, quickening of their operating speed that is a result of the speed-up of the CPU. This thermal load may cause deformation of the connector, which in turn results in loss of the engaging function of the engaging members. Outward elastic deformation of the top ends of the arms by fingers may cause plastic deformation. Such loss of the engaging function and deformation may cause problems of defective connection and disconnection of the printed circuit board. Heat generation also poses a problem that it may make the operation of the semiconductor memories unstable. Moreover, if the connector is exposed to effects of ambient electromagnetic waves or the like, the operation of the circuits may become unstable. These problems are not limited to the connector that is used for printed circuit boards having semiconductor memories. Such problems are common to the connector that is used for printed circuit boards having general semiconductor chips.

Hence a connector that is effective in providing both thermal load countermeasures and electromagnetic wave countermeasures will be disclosed in the following.

To accomplish the above-mentioned objective, the cap for printed circuit board according to the present invention is a cap that is to be fitted onto a printed circuit board that has a conductive pad on the front side of a rectangular board and is to be connected to a connector. This cap is shaped into a bag that can be put over the front side of the printed circuit board, and is formed into a wedge so that the thickness thereof corresponding to the direction of board thickness of the printed circuit board is reduced towards the front. The cap has a window through which the conductive pad of the printed circuit board is exposed.

When this cap is put over the front side of the printed circuit board and the front side of the printed circuit board is inserted towards the contact, the contacting surface of the contact will be smoothly guided along the slope of the wedge-shaped cap into the window to come into contact with the conductive pad of the printed circuit board in the window. Thus, without reducing the contact force of the conductive pad of the printed circuit board and the contact, the insertion force of the printed circuit board is reduced and the connection workability is improved. Moreover, damages or the like to the contact and the conductive pad are eliminated and the reliability of the connector is enhanced. Similar effects may be obtained by chamfering the printed circuit board. Such chamfering, however, has drawbacks that the existing printed circuit boards can not be used directly, that beveling the edges of the front side of the printed circuit board may cause peeling of the conductive pad or scattering of the plated layers and, in turn, cause losses in terms of costs. In contrast to it, as the cap according to the present invention does not require any working on the printed circuit board, existing circuit boards can be used directly, and there will be no losses in terms of costs due to peeling of conductive pads and scattering of plated layers.

The low insertion force connector according to the present invention is a low insertion force connector that connects a printed circuit board having conductive pads on the front side of the rectangular board thereof, and this low insertion force connector comprises:

a connector body having at least a pair of contacts being to contact the conductive pads and clamp the printed circuit board;

a slider that is supported by the connector body so that the slider can be advanced to or retreated from the contacts and that is to carry and retain the printed circuit board; and a wedge-shaped guide, which is provided on the front edge of the slider, of which rear end is continuous to the front side of the printed circuit board being on the slider, and of which thickness corresponding to the board thickness direction of the printed circuit board is reduced toward the front.

This low insertion force connector is mounted on a counterpart board by, for example, soldering the solder tails of the contacts onto the counterpart board. When the printed circuit board is placed on the slider and the slider is moved forward, the front side of the printed circuit board will be inserted into the contacts of the connector body. In the process, the contacting surfaces of the contacts will be guided smoothly along the slopes of the wedge-shaped guide onto the printed circuit board to contact the conductive pads. As a result, without reducing the contact forces between the conductive pads of the printed circuit board and the contacts, the insertion force of the printed circuit board can be reduced to improve the connection workability. Moreover, damages or the like to the contacts and conductive pads are eliminated, and the reliability of the connector is enhanced. When the slider is retreated, the printed circuit board will be withdrawn from the contacts. Similar effects can be obtained by chamfering the printed circuit board. This chamfering, however, has drawbacks that it can not be directly applied to the existing printed circuit boards, that beveling of the edges of the front side of the printed circuit board may cause peeling of the conductive pad and scattering of plated layers, and in turn, losses in terms of cost. In contrast to it, the low insertion force connector according to the present invention does not require working on the printed circuit boards, and the existing printed circuit boards can be used directly. Moreover, the connector is free of losses in terms of cost due to peeling of the conductive pad and scattering of plated layers.

BRIEF DESCRIPTION OF THE DRAWINGS

FIG. 6A shows the printed circuit board in the process of insertion in the insertion/withdrawal position, and FIG. 6B shows the printed circuit board in the connection position.

PREFERRED EMBODIMENTS OF THE INVENTION

In the following, embodiments of the cap for printed circuit board and embodiments of the low insertion force connector according to the present invention will be described. Each embodiment will be described by using a system of directions that is based on the directions to the front, to the rear, to the left, to the right, to the top and to the bottom, respectively. This system of directions is used only for the cap and the connector just to facilitate the description. The system of directions is not related to the actual directions of the counterpart board onto which the connector is mounted and the device in which the counterpart board is stored.

Figure 1A:
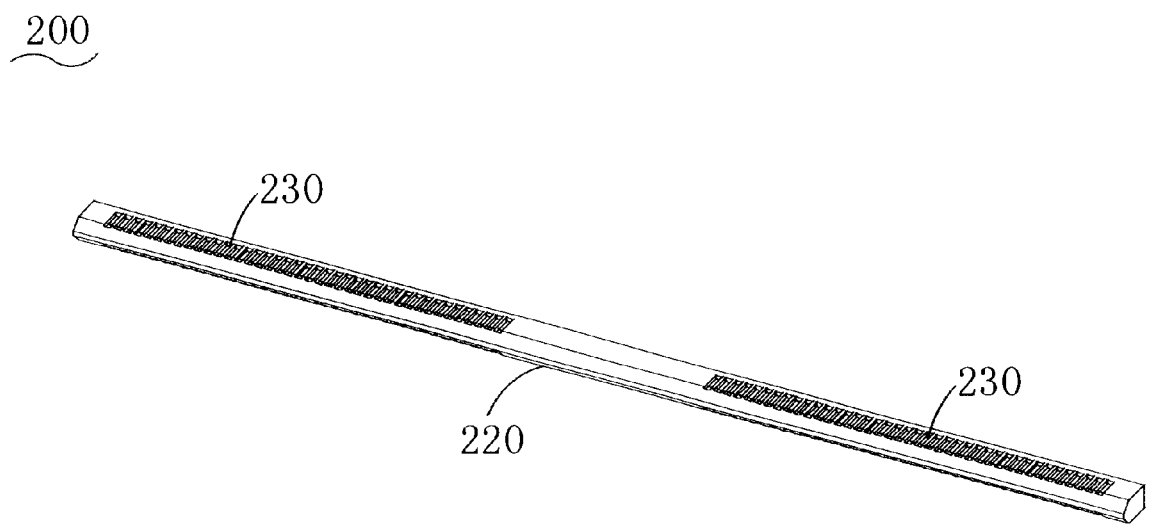
FIG. 1A is a perspective view of the cap of the first embodiment.
Figure 1B:
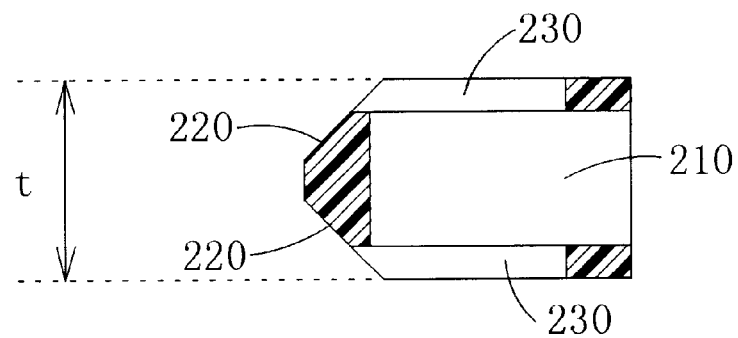
FIG. 1B is a vertical sectional view of the cap.
Figure 2:
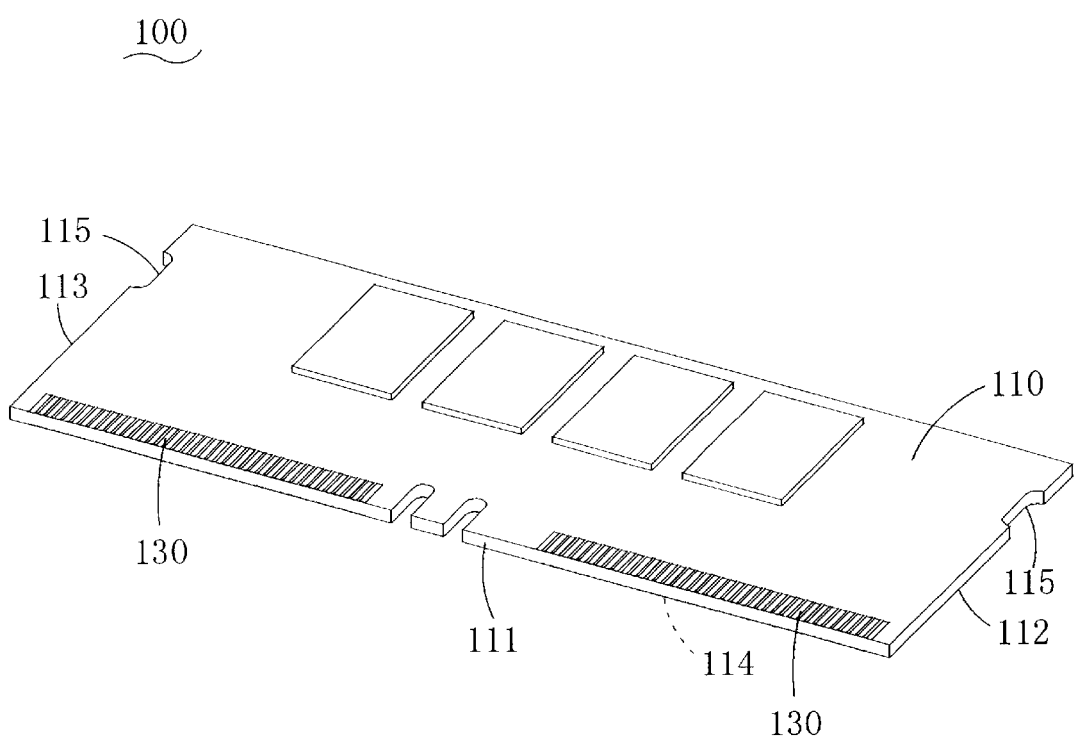
FIG. 2 is a perspective view of a printed circuit board that is used in the first embodiment.

FIG. 1A through FIG. 3B show the first embodiment of the cap. FIG. 2 shows a printed circuit board 100 that is to be connected to the connector. Conductive pads 130 being made of a conductive material are arranged on both the face and the back of the front side 111 of a rectangular board 110. In addition to this, the present invention is applicable to printed circuit boards wherein conductive pads are provided only on the face of the front side of the board and printed circuit boards wherein conductive pads are provided only on the back of the front side of the board. In this embodiment, semiconductor chips 120 are mounted on the board 110, but the present invention is also applicable to printed circuit boards wherein no semiconductor chips are mounted. If necessary, notches 115 that are concaved in the left side 112 and the right side 113 of the printed circuit board 100. For the convenience of description, the marks used for the front side, sides, bottom, etc. of the board 110 are intactly used as the marks for the front side, sides, bottom, etc. of the printed circuit board 100.

FIG. 1A and FIG. 1B shows a cap 200 that is to be fitted onto the printed circuit board 100. The cap 200 is formed of an insulating material such as a resin into a bag that is to be put over the front side 111 of the printed circuit board 100. A receiving part 210, which opens towards the rear, is formed inside the cap 200. As shown in FIG. 1B, the cap 200 is formed into a wedge, of which thickness t that corresponds to the board thickness of the printed circuit board 100 is reduced towards the front. As a result, two slopes 220 that are tilted towards the front are formed. Windows 230 that expose the conductive pads 130 of the printed circuit board 100 are opened in the cap 200. In FIG. 1A and FIG. 1B, to increase the strength, separate windows 230 are opened for the respective conductive pads 130 and there is a crosspiece between each of two adjacent windows. However, windows may be formed continuously.

Figure 4:
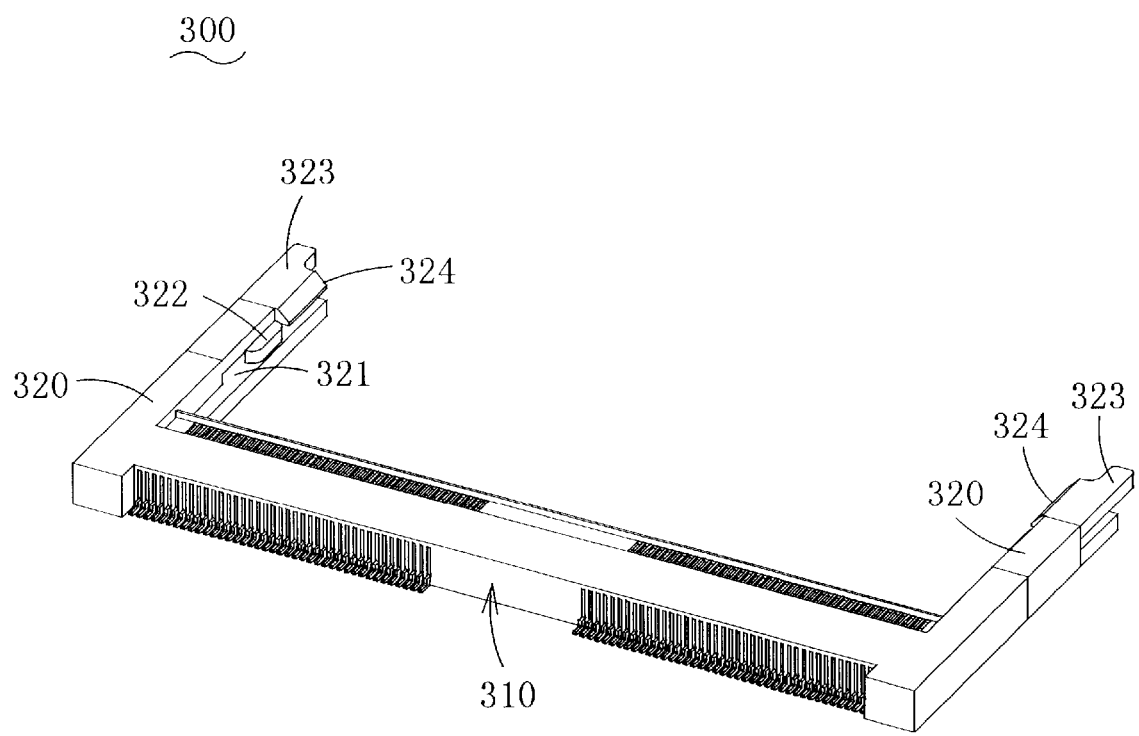
FIG. 4 is a perspective view of a connector that is used in the first embodiment.
Figure 5:
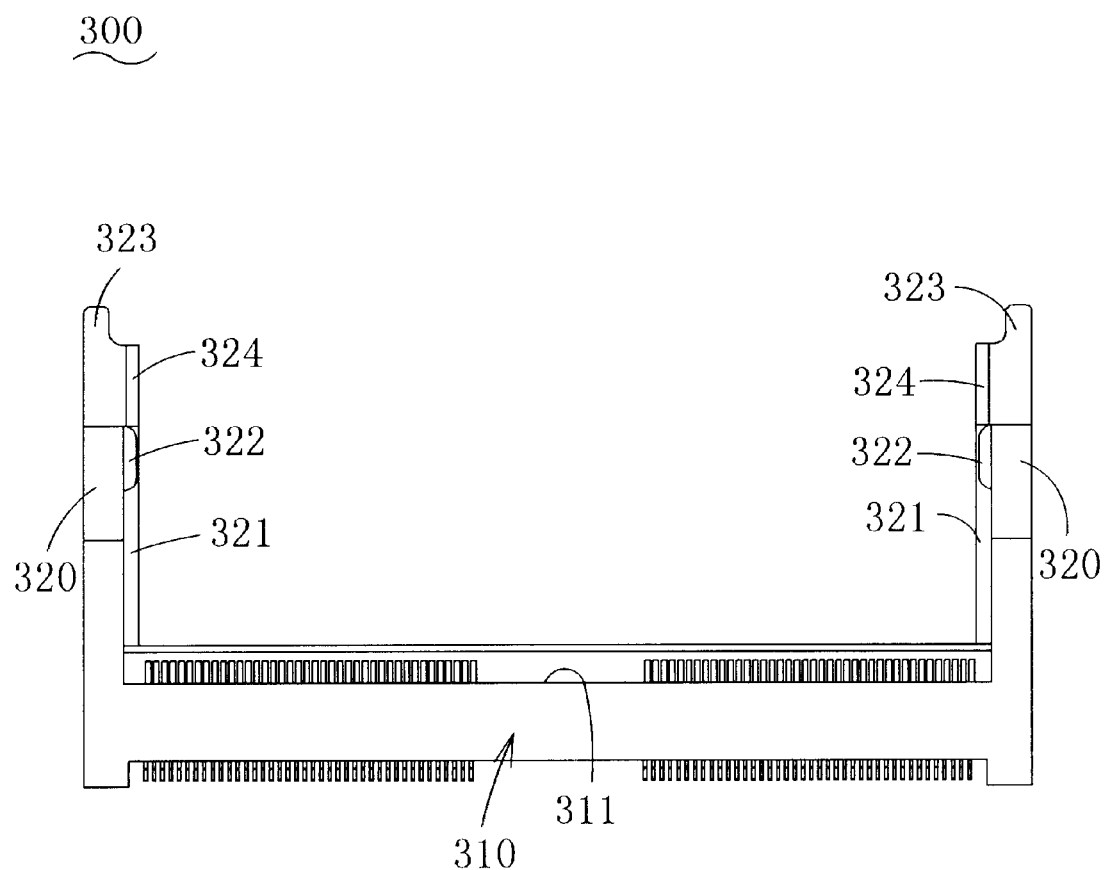
FIG. 5 is a plan view of the connector that is used in the first embodiment.
Figure 6A:
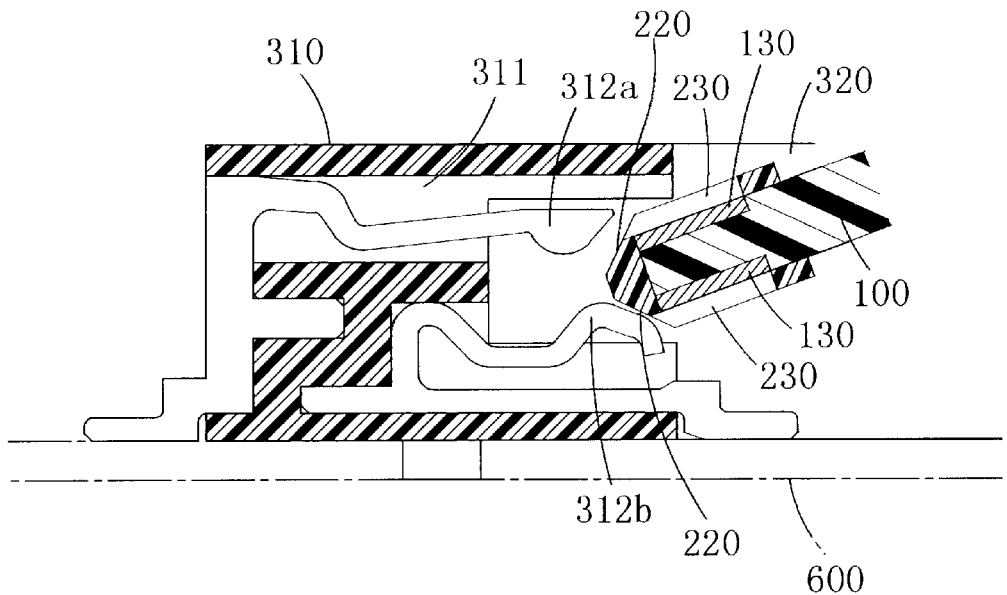
FIG. 6A and FIG. 6B are magnified vertical sectional views of the connector body of the connector that is used in the first embodiment.
Figure 6B:
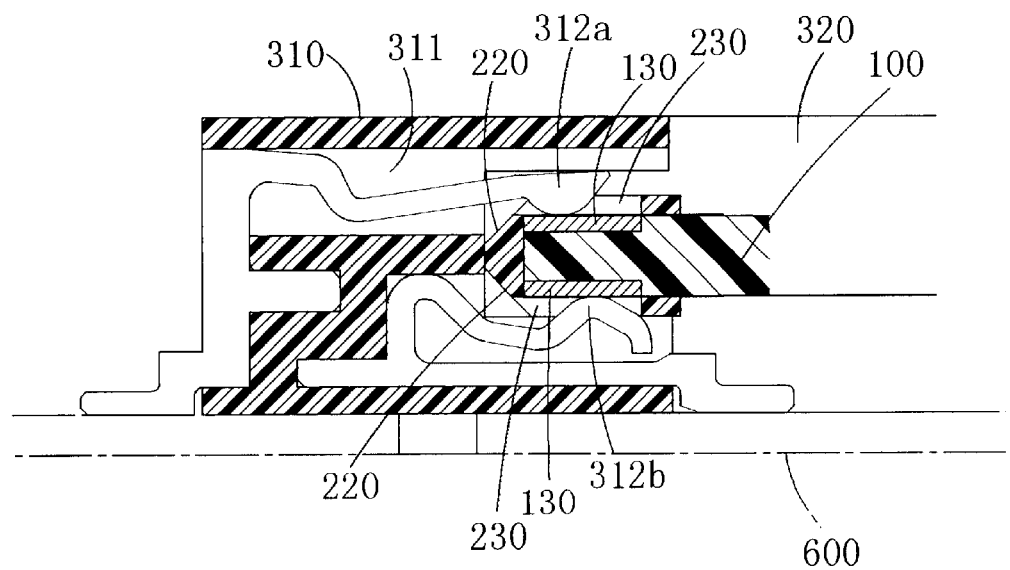

FIG. 4 and FIG. 5 show a connector 300 that connects the abovementioned printed circuit board 100. This connector 300 connects the printed circuit board 100 to a counterpart board 600 in such a way that both boards are approximately parallel to each other. This connector 100 comprises a connector body 310 that corresponds to the front side of the printed circuit board 100, and arms 320 that correspond to the left side and right side of the printed circuit board 100 and extend rearward from the left end and the right end of the connector body 310. A groove 311 is formed in the connector body 310 to receive the front side of the printed circuit board 100, and this groove 311 is provided with plural contacts 312a, 312b that are to contact the conductive pads 130 on both faces of the printed circuit board 100 and clamp the printed circuit board 100. As shown in FIG. 6A and FIG. 6B, in the groove 311 the contacting surfaces of the contacts 312a are arranged above, and the contacting surfaces of the contacts 312b are arranged below; thus these sets of contacts are substantially opposed to each other. At least a pair of contacts 312a, 312b is provided. When a printed circuit board, in which conductive pads are provided only on the face of the front side of the board, is used, contacts may be provided only on the upper side. When a printed circuit board, in which conductive pads are provided only on the back of the front side of the board, is used, contacts may be provided only on the lower side. The present invention includes embodiments wherein the arm 320 is formed integrally rather than in two arms, a right one and a left one.

On the inner side of each arm 320 a stepped part 321, which is L-shaped or inverted-L-shaped when seen from the rear, is provided. The bottom 114 of the printed circuit board 100 is received by the horizontal surfaces of the stepped parts 321, and the left side 112 and the right side 113 are received by the vertical surfaces of the stepped parts 321. Each stepped part 321 is provided with a positioning projection 322 for positioning the printed circuit board 100. The top end 323 of each arm 320 can undergo elastic deformation leftward or rightward, and a engaging claw 324 is formed inwardly on the inner side of the top end.

Figure 7:
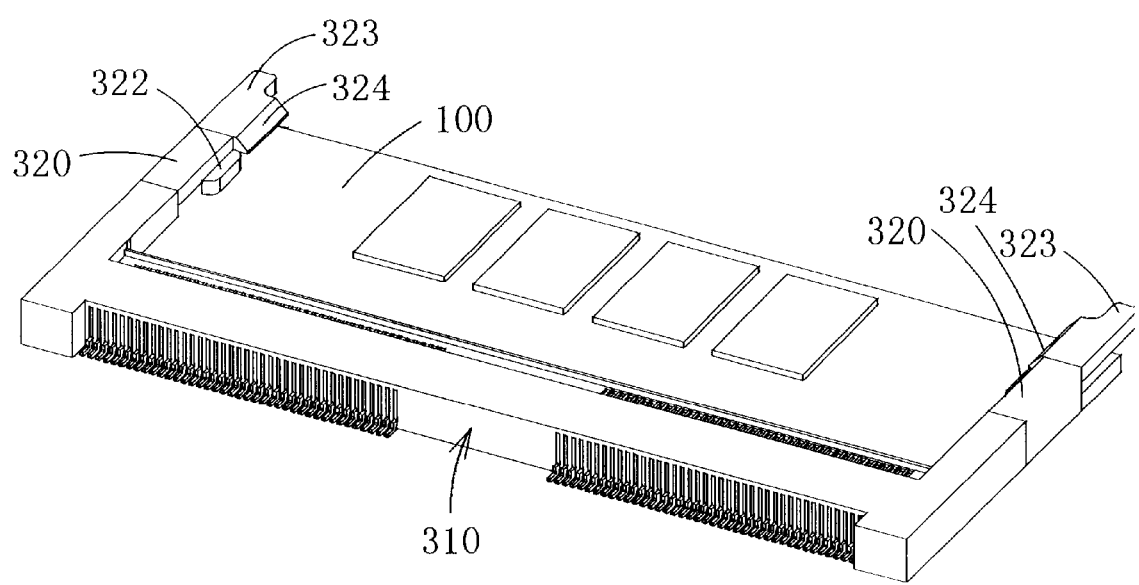
FIG. 7 is a perspective view of the connector in which the printed circuit board of the first embodiment is fitted.
Figure 8A:
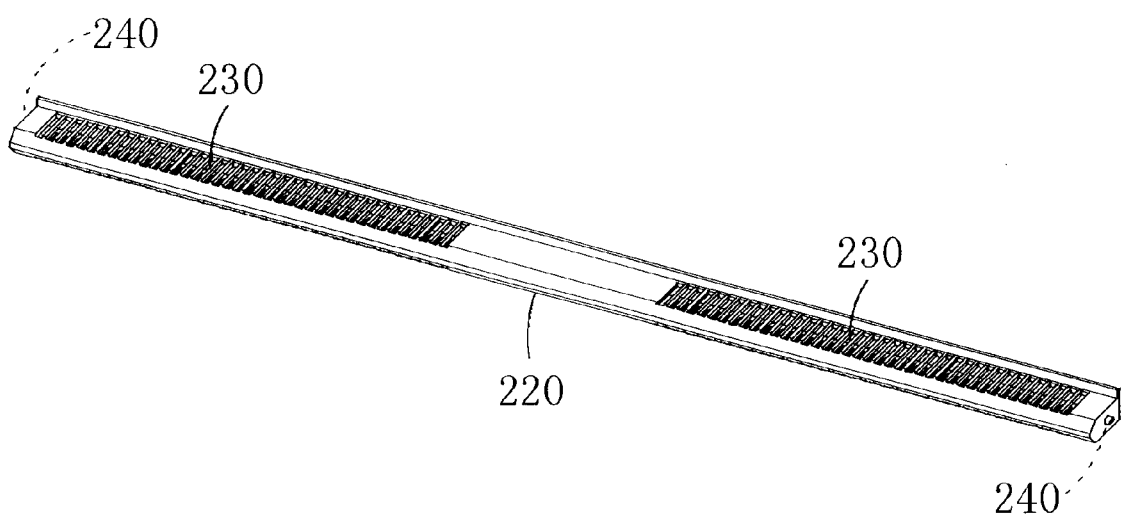
FIG. 8A is a perspective view of the second embodiment of the cap.
Figure 8B:
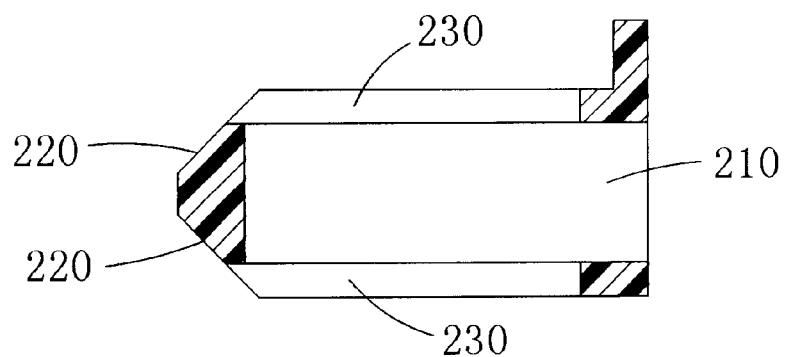
FIG. 8B is a vertical sectional view thereof.
Figure 9A:
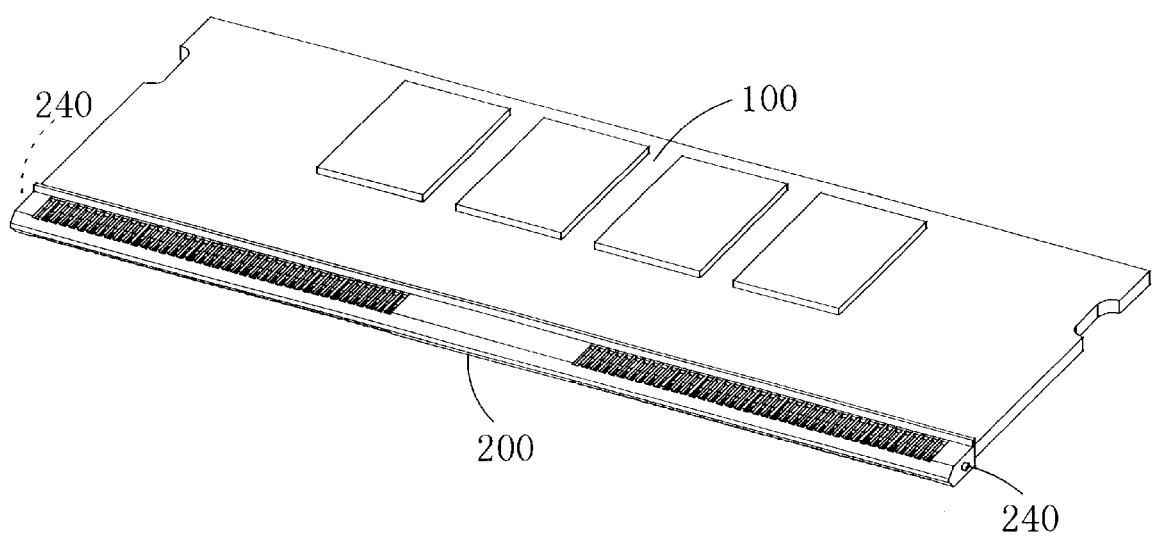
FIG. 9A is a perspective view showing the second embodiment of the cap is put over the above-mentioned printed circuit board.
Figure 9B:
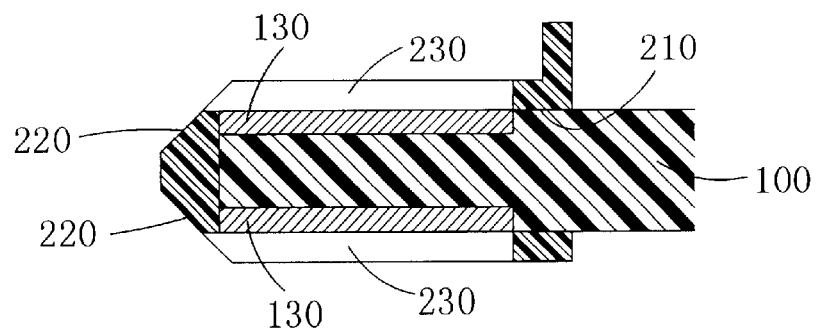
FIG. 9B is a vertical sectional view thereof.
Figure 10:
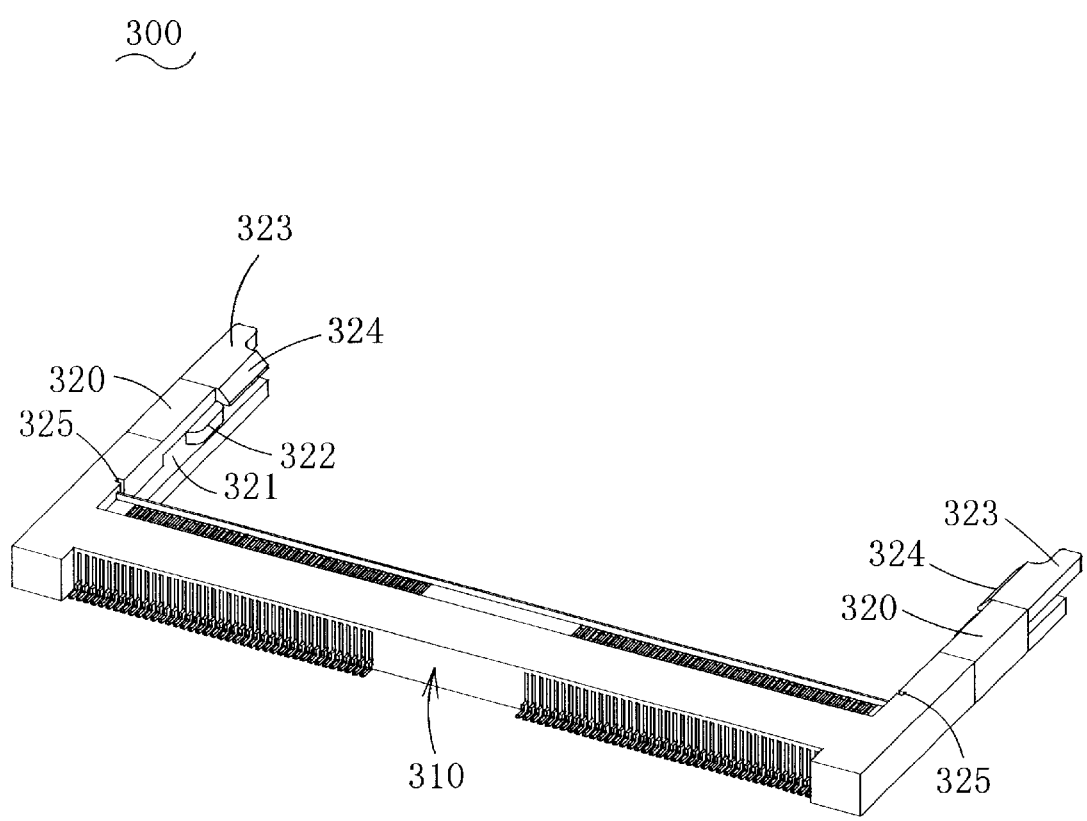
FIG. 10 is a perspective view of a connector that is used in the second embodiment.
Figure 11:
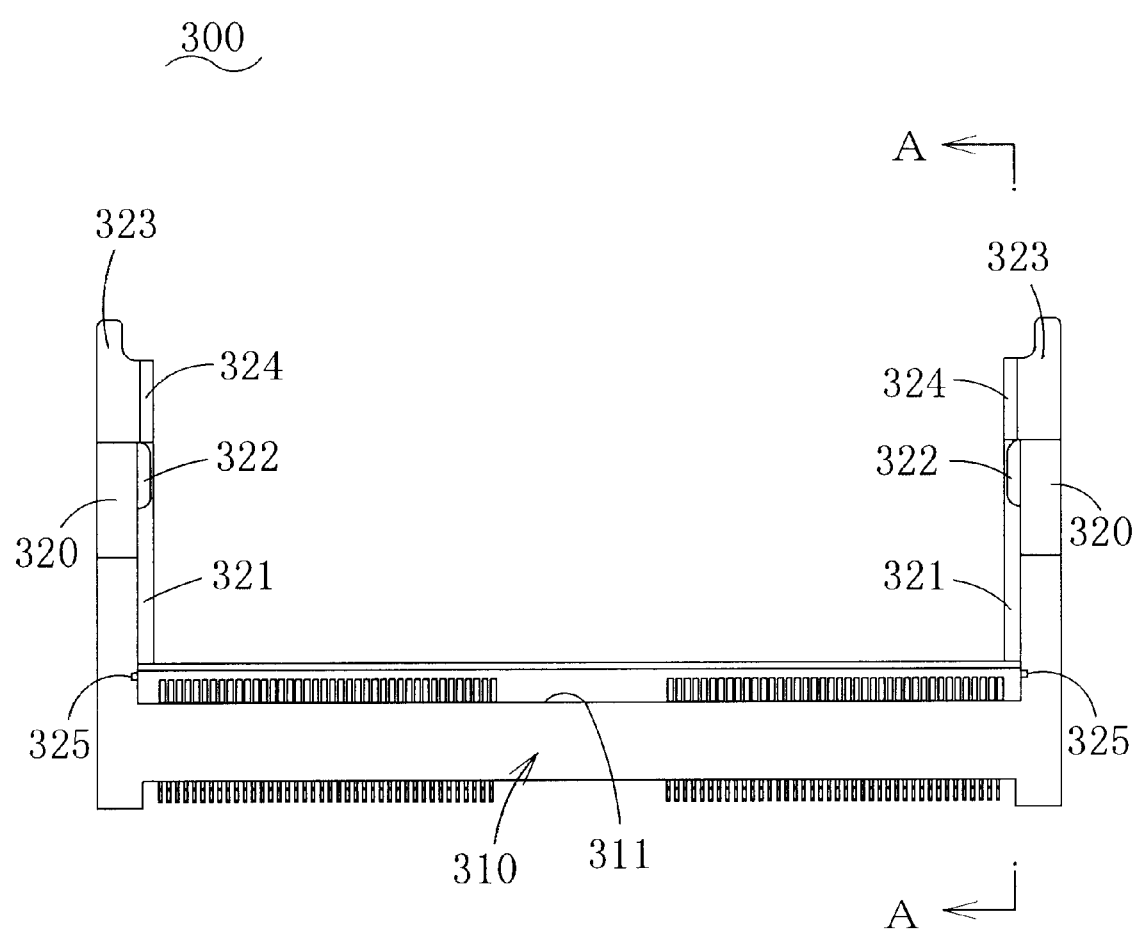
FIG. 11 is a plan view of the connector that is used in the second embodiment.
Figure 12:
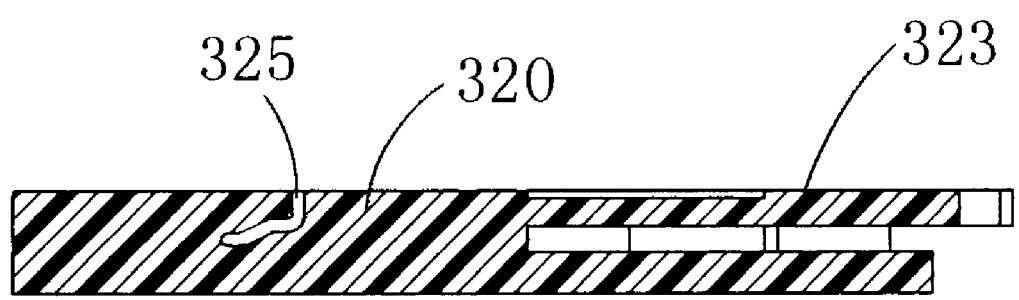
FIG. 12 is a sectional view along the line A—A of FIG. 11.

The connector 300 is mounted on the counterpart board 600 by soldering the solder tails of the contacts 312a, 312b onto the counterpart board 600. When the printed circuit board 100 is to be fitted into the connector 300, first, the printed circuit board 100 is set in the insertion/withdrawal position in which its rear end is lifted more in comparison with its level in the connection position, and the front side 111 is inserted between the opposing upper and lower sets of contacts 312a, 312b (refer to FIG. 6A). Next, the rear side of the printed circuit board 100 is pushed downward. Then the conductive pads 130 of the printed circuit board 100 and the contacts 312a, 312b will contact with each other (refer to FIG. 6B). Moreover, the top ends 323 of the arms 320 will be pushed away outward, and the printed circuit board 100 will slip under the engaging claws 324. The engaging claws 324 returning to their respective initial position will engage the left side and the right side of the printed circuit board 100. This will retain the printed circuit board 100 in the connection position (refer to FIG. 7). When the fitted printed circuit board 100 is to be disconnected from the connector 300, the top ends 323 of the arms 320 are made by fingers to undergo elastic deformation outward so as to disengage the engaging claws 324 from the printed circuit board 100. Then the rear side of the printed circuit board 100 will be lifted by the elastic restoring forces of the contacts 312a, 312b and the printed circuit board 100 will be shifted from the connection position to the insertion/withdrawal position. Now the printed circuit board 100 can be withdrawn from the space between the contacts.

Figure 3A:
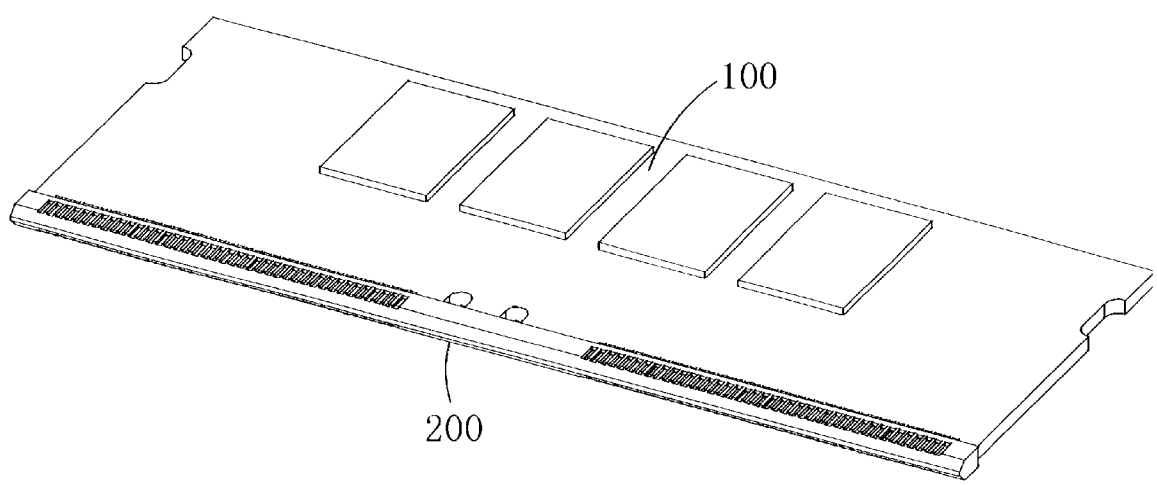
FIG. 3A is a perspective view showing the first embodiment of the cap is put over the above-mentioned printed circuit board.
Figure 3B:
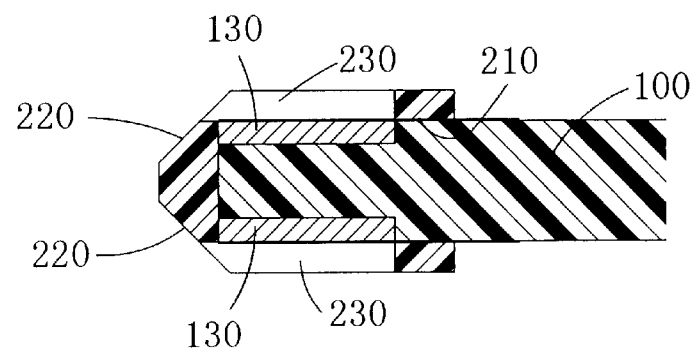
FIG. 3B is a vertical sectional view thereof.

In this case, as shown in FIG. 3A and FIG. 3B, if the above-mentioned cap 200 is put over the front side 111 of the printed circuit board 100 before inserting the front side 111 of the printed circuit board 100 between the contacts, the contacting surfaces of the contacts 312a, 312b will be guided smoothly, as shown in FIG. 6A and FIG. 6B, along the slopes 220 of the wedge-shaped cap 200, into the windows 230, and will contact the conductive pads 130 of the printed circuit board 100 in the windows 230. Thus the insertion force of the printed circuit board 100 is reduced and the connection workability is improved without reducing the contact forces between the conductive pads 130 of the printed circuit board 100 and the contacts 312a, 312b. Moreover, damages or the like to the contacts 312a, 312b and the conductive pads 130 are eliminated and the reliability of the connector 300 is enhanced. Similar effects may be obtained by chamfering the printed circuit board 100. Such chamfering, however, has drawbacks that it can not be directly applied to the existing printed circuit boards, that beveling the edges of the front side of the printed circuit board 100 may cause peeling of the conductive pads 130 or scattering of the plated layers and, in turn, cause losses in terms of costs. In contrast to it, with the use of the cap 200 of the above-mentioned embodiment, no such problems will be generated.

FIG. 8A through FIG. 12 shows the second embodiment of the cap and a connector therefor. The description of the first embodiment is intactly quoted to the second embodiment, and only differences between the first embodiment and the second embodiment will be described below. Of the functions and effects of the second embodiment, those that have been described in relation to the first embodiment will not be described repeatedly. In this second embodiment, the cap 200 is fitted to the connector 300 in such a way that the cap 200 can advance towards the contacts 312a, 312b of the connector 300 and retreat from the contacts 312a, 312b. Bar-shaped pins 240 protruding sideways are provided on the left side end and the right side end of the cap 200, and these pins 240 are slidably fitted into pin guide grooves 325 that are formed in the inner sides of the arms 320 of the connector 300. These pin guide grooves 325 start from their initial ends reaching the tops of the arms 320, extends forward and downward towards the contacts 312a, 312b to reach the terminal ends.

Figure 13A:
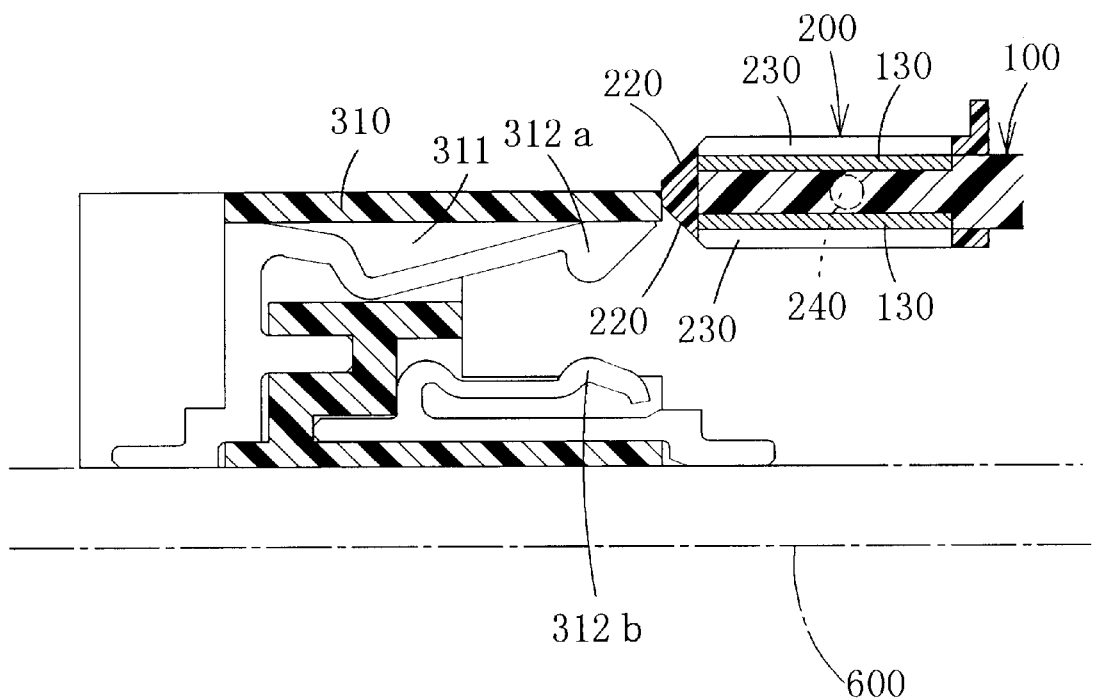
FIG. 13A is an enlarged vertical sectional view of the connector body of the connector that is used in the second embodiment.
Figure 13B:
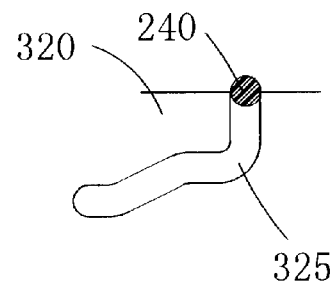
FIG. 13B is an enlarged view of a pin and a guide groove for pin. Both diagrams show a state when the pin is at the starting end of the pin guide groove and the cap is most distant from the contacts.
Figure 14A:
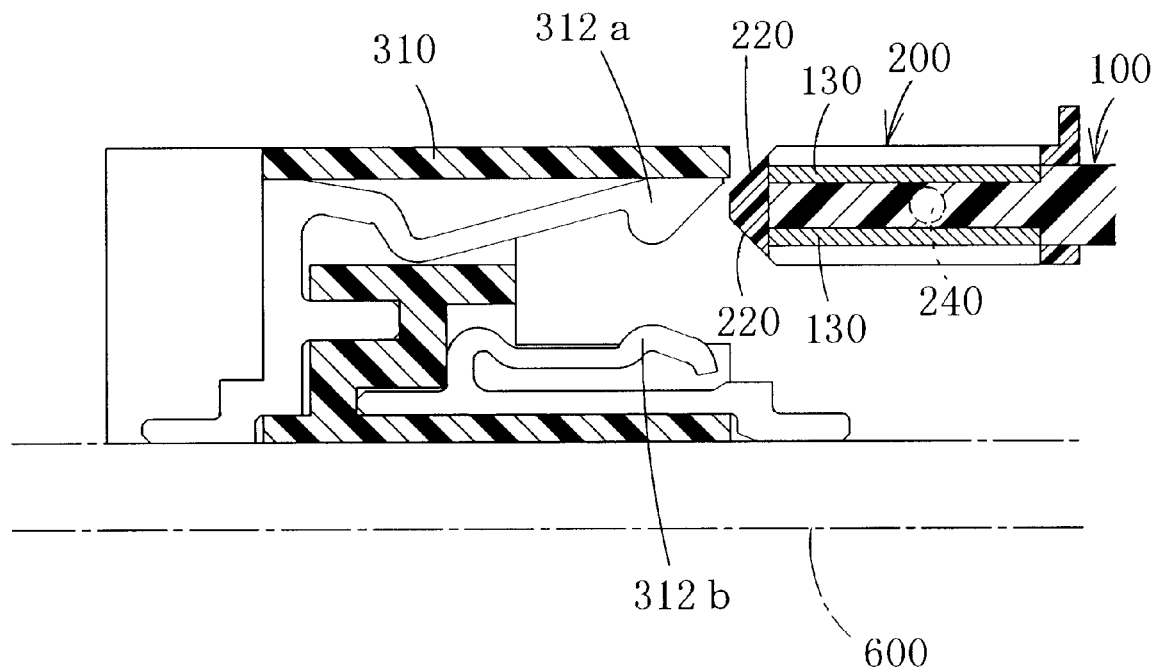
FIGS. 14A and 14B are diagrams similar to FIG. 13 and shows the state when the pin is a little below the point shown in FIG. 13.
Figure 14B:
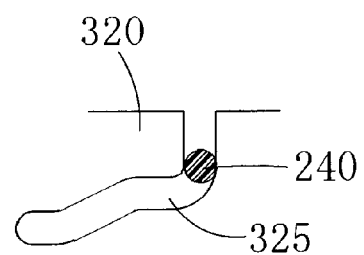
Figure 15A:
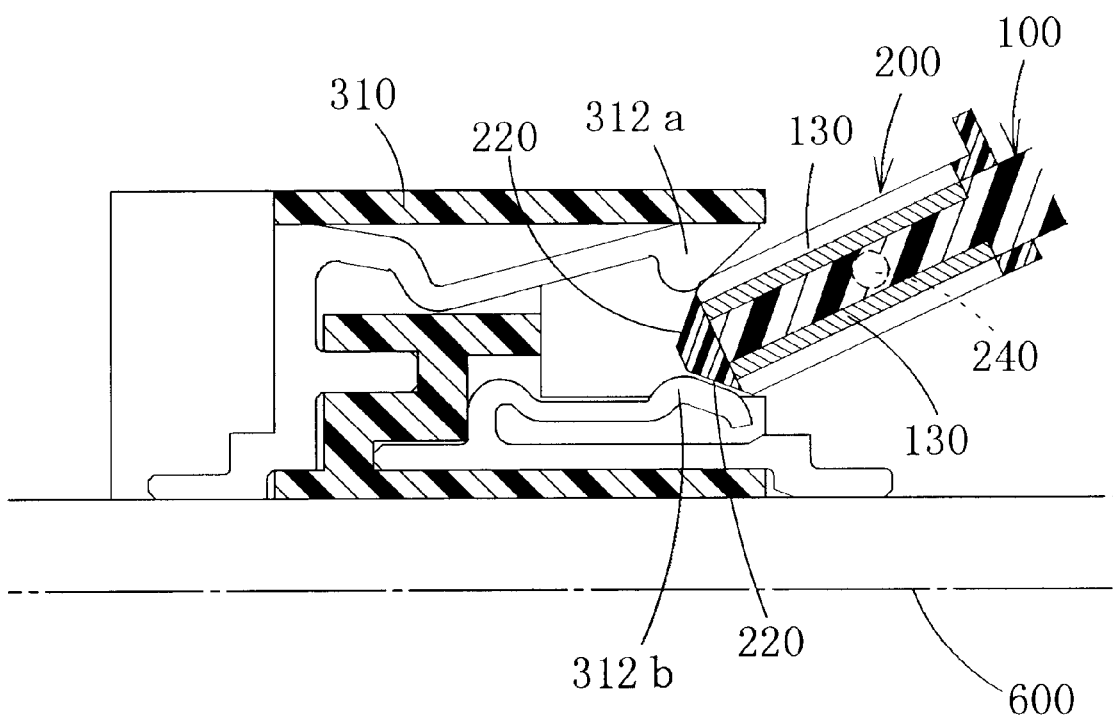
FIGS. 15A and 15B are diagrams similar to FIG. 13 and shows the state when the printed circuit board is in the insertion/withdrawal position.
Figure 15B:
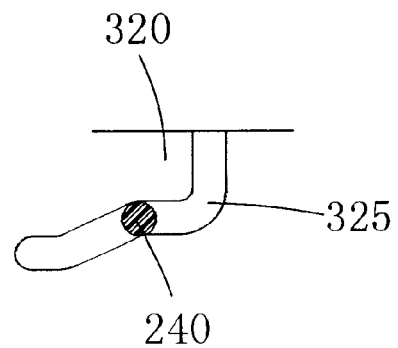
Figure 16A:
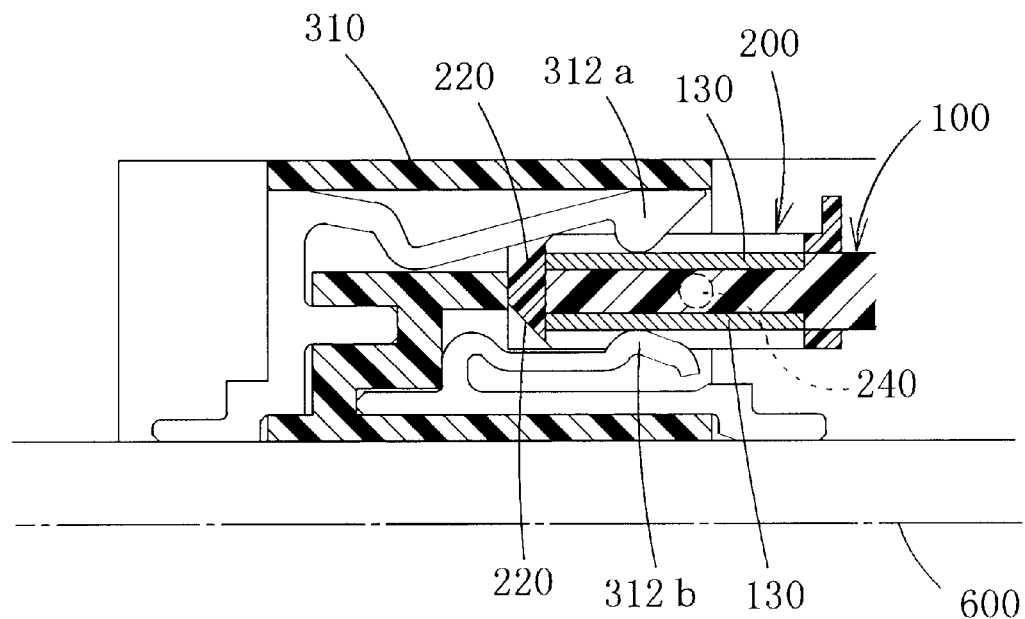
FIGS. 16A and 16B are diagrams similar to FIG. 13 and shows the state when the printed circuit board is in the connection position.
Figure 16B:
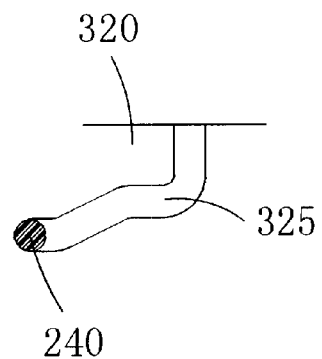
Figure 17:
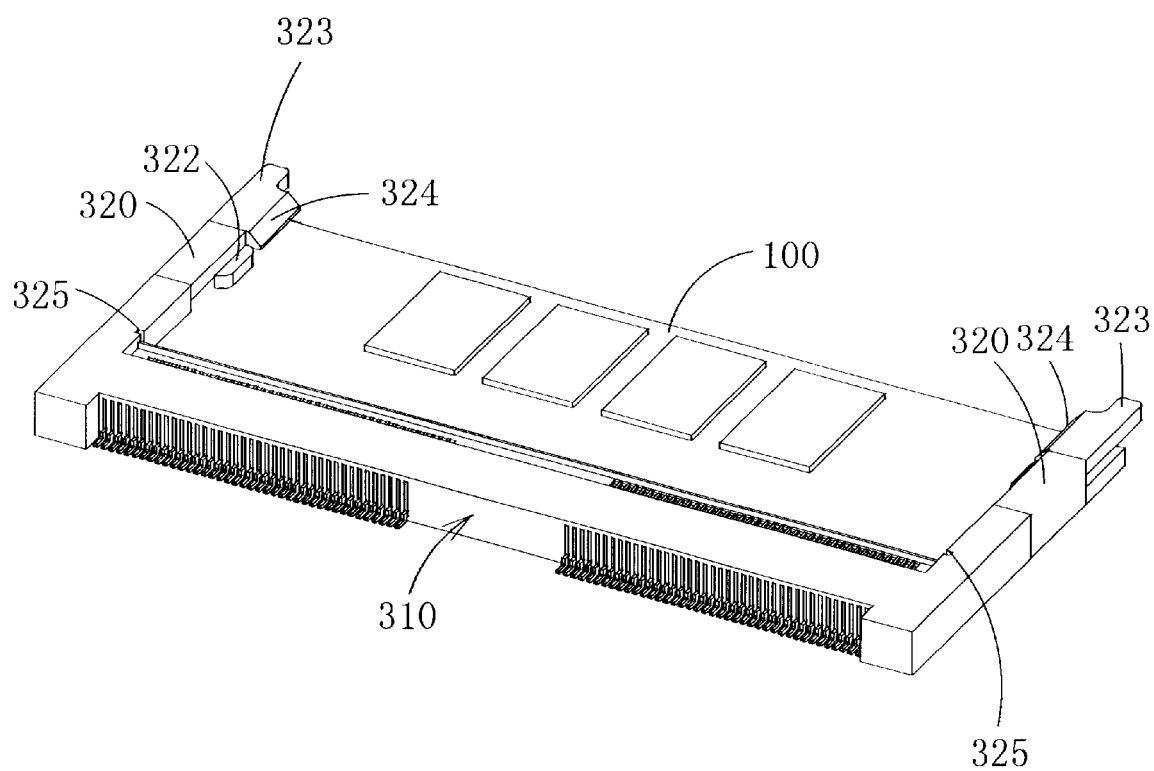
FIG. 17 is a perspective view of the second embodiment of the connector in which the printed circuit board is fitted.

When the printed circuit board 100 is to be fitted into this connector 300, first, the pins 240 are set at the initial ends of the pin guide grooves 325 to keep the cap 200 most distant from the contacts 312a, 312b, then the front side 111 of the printed circuit board 100 is inserted into the cap 200 (refer to FIG. 13A and FIG. 13B). Next, the printed circuit board 100 is brought to the insertion/withdrawal position, and the front side 111 is inserted into the space between the opposing upper and lower sets of contacts 312a, 312b (refer to FIG. 14 and FIG. 15). Next, the rear side of the printed circuit board 100 is pushed down. As a result, the conductive pads 130 of the printed circuit board 100 and the contacts 312a, 312b will contact with each other (refer to FIG. 16). Further, the top ends 323 of the arms 320 will be pushed away outward, and the printed circuit board 100 will slip under the engaging claws 324. The engaging claws 324 returning to their respective initial position will engage the left side and the right side of the printed circuit board 100. This will retain the printed circuit board 100 in the connection position (refer to FIG. 17). When the fitted printed circuit board 100 is to be disconnected from the connector 300, the above-mentioned procedure is reversed. And when the pins 240 are at the initial ends of the pin guide grooves 325 and the cap 200 is most distant from the contacts 312a, 312b, the printed circuit board 100 is withdrawn from the cap 200.

With the arrangement of the second embodiment, when the front side 111 of the printed circuit board 100 is inserted into the cap 200 being fitted to the connector 300 and the printed circuit board 100 is pushed towards the contacts 312a, 312b, the front side 111 thereof will be pushed into the contacts. When the printed circuit board 100 is pulled, the cap 200 and the printed circuit board 100 will be withdrawn from the contacts. When the printed circuit board 100 is pulled further, the printed circuit board 100 will be withdrawn from the cap 200. Thus the insertion and withdrawal of the printed circuit board 100 can be done with ease. Moreover, as the cap 200 is fitted to and is integral to the connector 300, handlability of the cap 200 is excellent.

Figure 18:
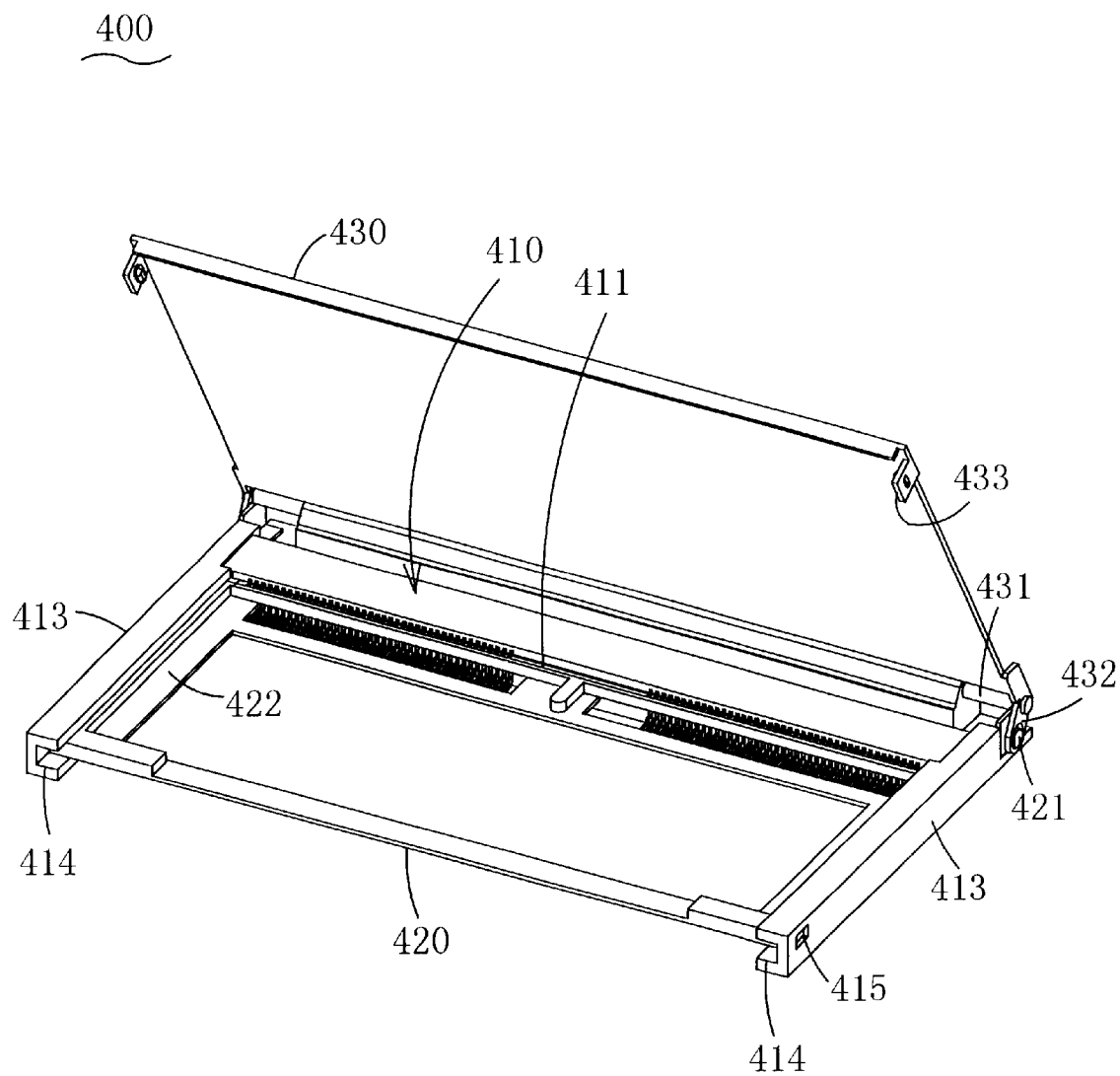
FIG. 18 is a perspective view of the third embodiment of the connector.

FIG. 18 through FIG. 29B show the third embodiment being an embodiment of the connector according to the present invention. This connector 400 is to connect the printed circuit board 100 wherein, as described above, conductive pads 130 are provided on the face and the back of the front side 111 of the rectangular board 110 (refer to FIG. 22). As shown in FIG. 18, the connector 400 comprises a connector body 410, and this connector body has an approximately-U-shaped form of which sides extend along the front side 111, the left side and the right side of the printed circuit board 100 being in the connection position.

Figure 27A:
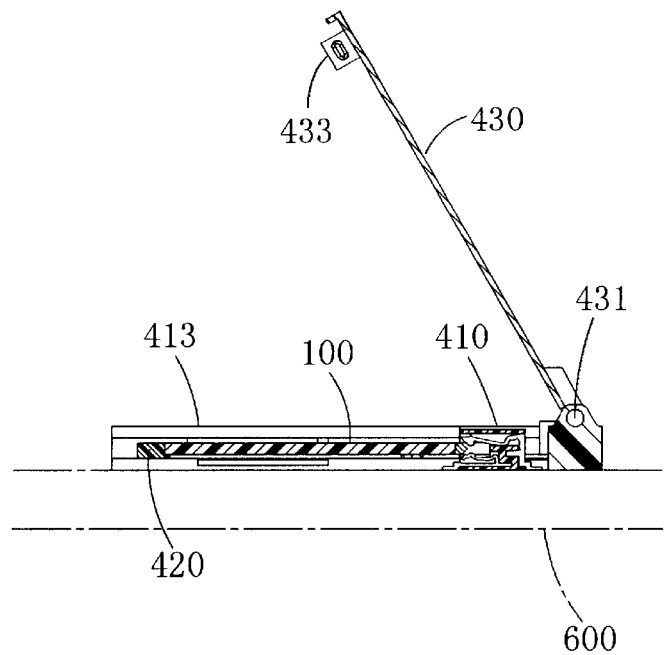
FIG. 27A is a vertical sectional view of the slider of the third embodiment of the connector carrying the printed circuit board.
Figure 27B:
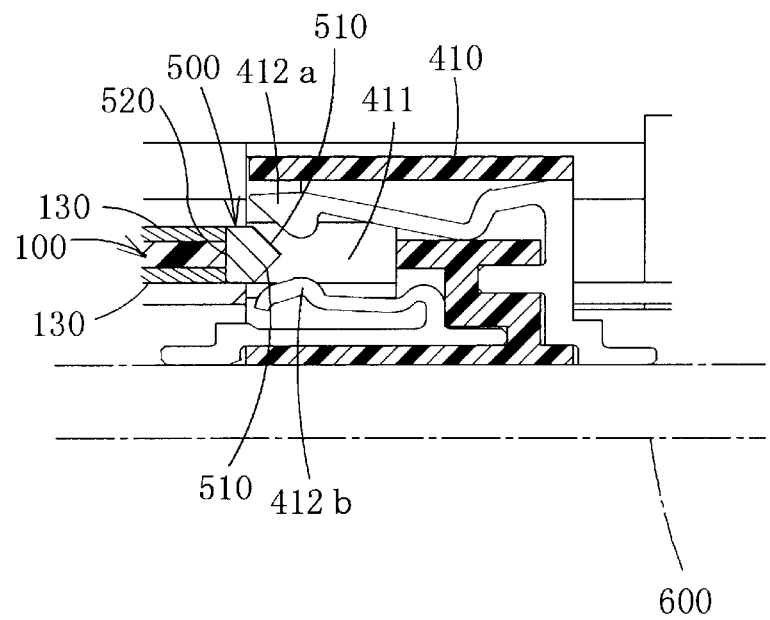
FIG. 27B is a partially magnified view thereof.
Figure 28:
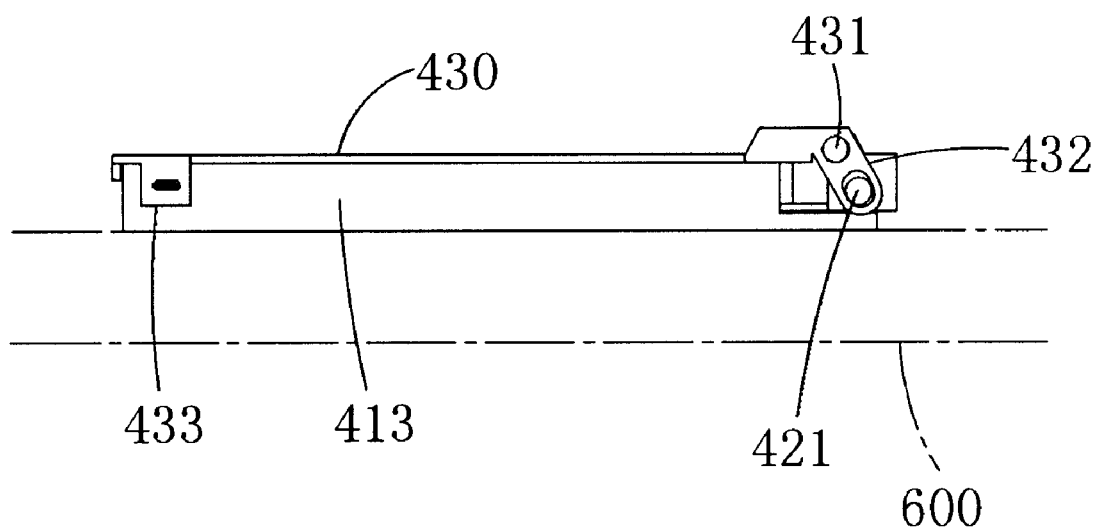
FIG. 28 is a side view of the slider of the third embodiment of the connector carrying the printed circuit board. The rear end of the cover is down.

The connector body 410 is provided with at least a pair of contacts 412a, 412b that are to contact the conductive pads on both the face and the back and clamp the printed circuit board 100. In this embodiment, as shown in FIG. 27B, a groove 411 for receiving the front side 111 of the printed circuit board 100 is formed in the rear of the central part of the connector body 410. In the groove 411 the contact surfaces of the contacts 412a are arranged on the upper side and the contact surfaces of the contacts 412b on the lower side, and the two sets of the contacts 412a, 412b are substantially opposed to each other. The distance between the upper contact 412a and the lower contact 412b corresponds to thickness of the front side 111 of the printed circuit board 100.

Figure 19:
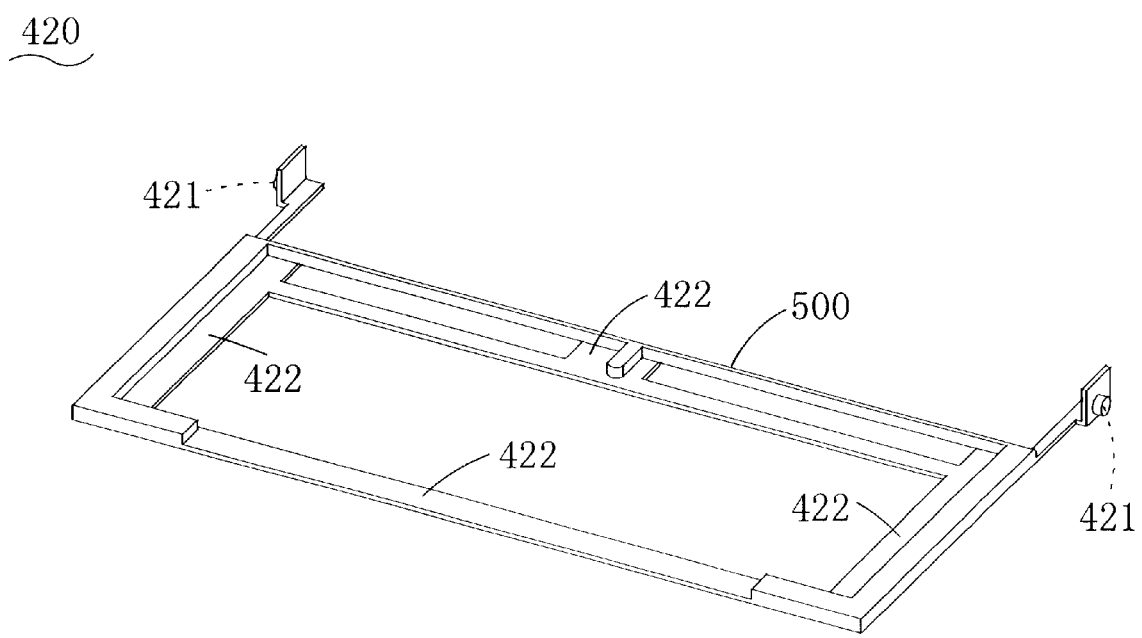
FIG. 19 is a perspective view of the slider of the third embodiment of the connector.

The connector body 410 is provided with a slider 420 that is slidably supported so that the slider 420 can be advanced to or retreated from the contacts 412a, 412b and that is to carry and retain the printed circuit board 100. In this embodiment, as shown in FIG. 19, the slider 420 is formed as a rectangular thin plate, and the central part of the top thereof is concave to form a recess 422. The printed circuit board 100 is fitted into this recess 422 to hold and prevent the printed circuit board 100 from moving in the front-rear direction and in the left-right direction. Guide grooves 414 are formed, in the front-rear direction, in the inner sides of the arms 413 extending along the left side and the right side of the printed circuit board 100 that is in the connector body 410. The left side end and the right end side of the slider 420 are fitted in the guide grooves 414 and the slider 420 can slide in the front-rear direction at a level that is substantially the level of the space between the contact surfaces of the contacts 412a, 412b. Another embodiment of the slider is one wherein protrusions are provided in the left and the right of the top, and these restricting protrusions are fitted into notches 115 or positioning holes that are formed through the printed circuit board 100 so as to restrict the shift of the printed circuit board 100 in both the front-rear direction and the left-right direction. When necessary, for example, a metallic reinforcing tab (not illustrated) is fixed to, for example, the arm 413 of the connector body 410, and this reinforcing tab is fixed to the counterpart board 600 by soldering, etc. The present invention includes an embodiment wherein arms are provided integrally rather than in two left and right arms.

This connector 400 is provided with a plate-like cover 430 of which front end is hinge-connected to the connector body 410 and which clamps the printed circuit board 100 with the slider 420. This cover 430 is made of a metal. Hinge-connection means that two members are connected with each other in such a way that they can rotate relative to each other around a hinge axis. This hinge-connection includes both a form wherein the connection is made with an actual bar-shaped hinge axis and a form wherein two members are fitted with each other so that they are rotatable relative to each other around a virtual hinge axis. The hinge-connection of this embodiment is realized by providing the connector body 410 with a hinge axis 431 that extends in the left-right direction, and connecting the cover 430 to this hinge axis 431. When the cover 430 is to be fitted to the connector body 210, the fitting structure may take a variety of forms. In this embodiment, fitting hooks 433 are formed by small pieces, which can flex in the left-right direction, on the left and the right of the rear end of the cover 430. When the cover 430 is put over the connector body 410, the fitting hooks 433 will enter into the fitting holes 415 that are concavely formed on the outer sides of the rear ends of the arms 413 to fit the cover 430 on the connector body 410.

The cover 430 is connected to the slider 420 in such a way that when the rear end of the cover 430 is lowered or raised, the slider 420 will be slid forward or rearward. In this embodiment, links 432 are fixed to both the left end and the right end of the cover 430 in a radial direction of the hinge axis 431, and the top ends of the links 432 are connected to the slider 420. When the rear end of the cover 430 is up, the slider 420 will be in the most withdrawn rearward position (refer to FIG. 26 through FIG. 27B), and when the rear end of the cover 430 is lowered, the slider 420 will move forward (refer to FIG. 28 through FIG. 29B). The connection of the links 432 to the slider 420 is realized by fitting the axis 421 extending leftward and rightward from the slider 420 into oblong holes being formed at the top ends of the links 432. With this structure, the printed circuit board 100 is placed on the slider 420 when the rear end of the cover 430 is up, and then when the rear end of the cover 430 is lowered, the slider 420 will move forward, and the front side 111 of the printed circuit board 100 will be inserted into the space between the contacts 412a, 412b of the connector body 410. When the procedure is reversed, the printed circuit board 100 will be withdrawn from the space between the contacts 412a, 412b. The links may be provided to the slider and the cover may be connected to these links. As for structures wherein the cover is connected to the slider in such a way that the slider is slid forward or rearward as the rear end of the cover is moved downward or upward, well-known mechanisms such as the rack and pinion mechanism may be used, and the present invention include embodiments that use such a structure.

Figure 20:
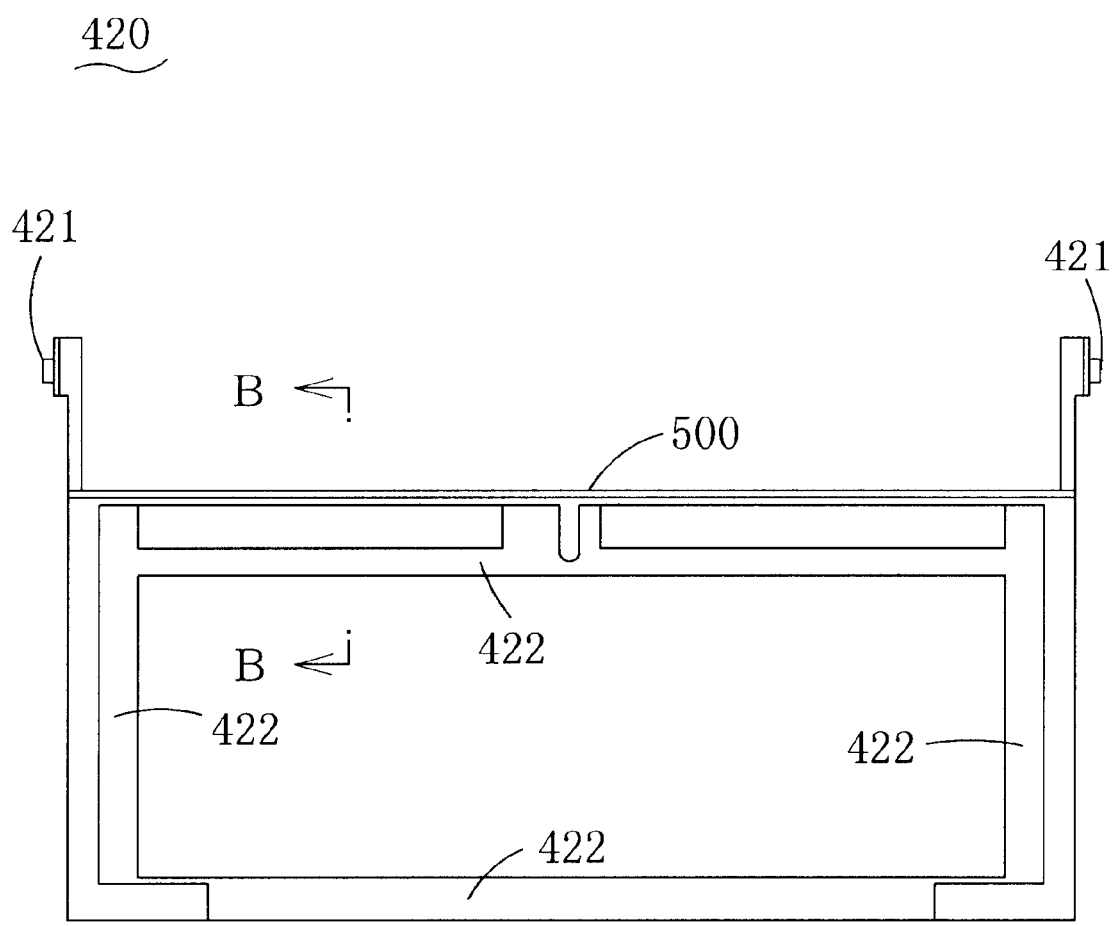
FIG. 20 is a plan view of the slider of the third embodiment of the connector.
Figure 21:
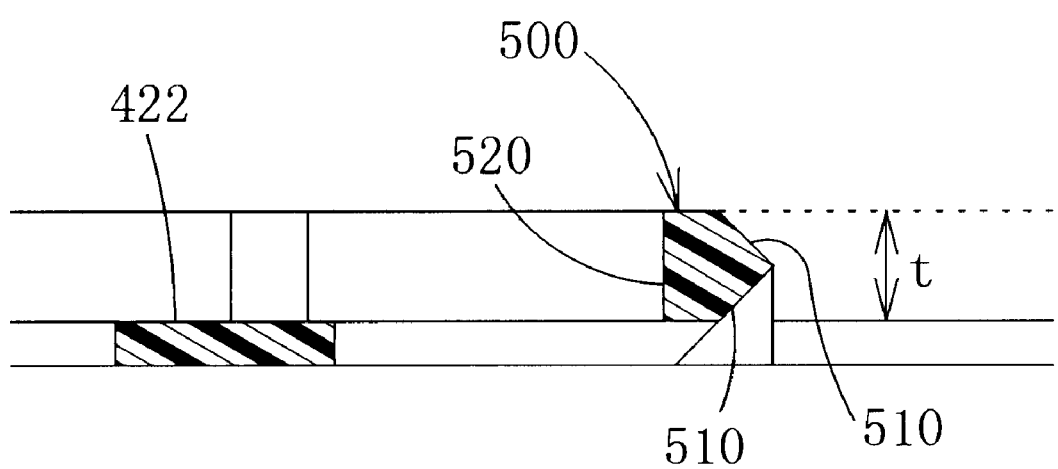
FIG. 21 is a sectional view along the line B—B of FIG. 20.
Figure 22:
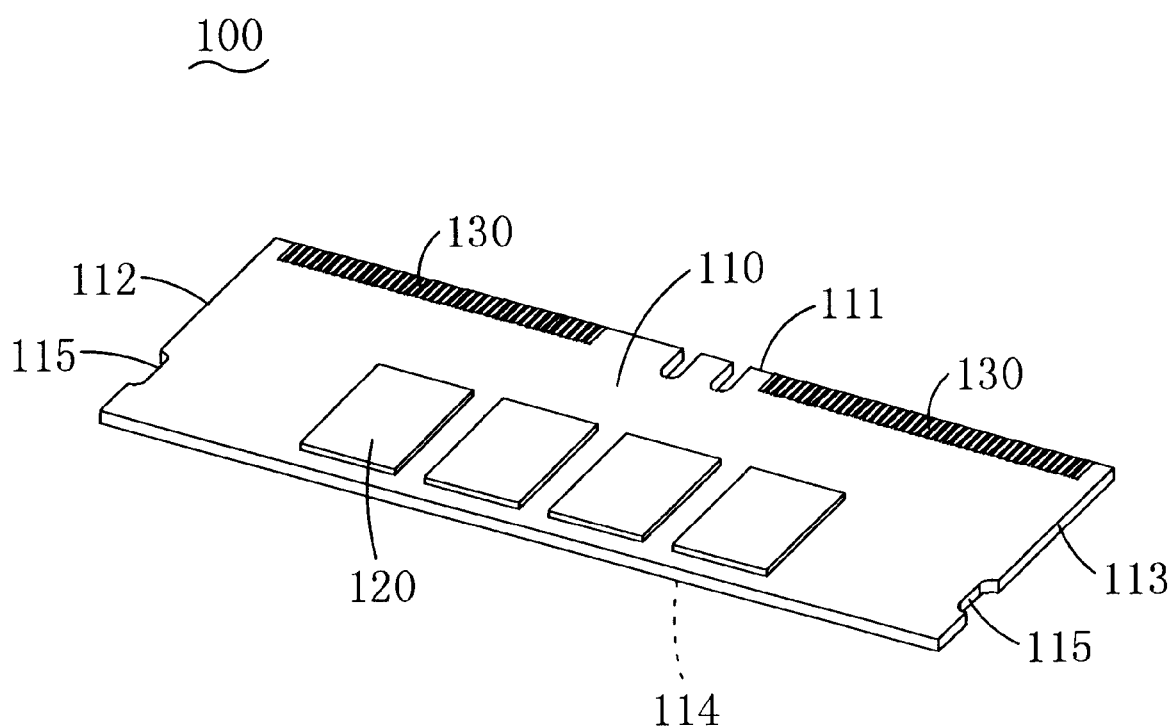
FIG. 22 is a perspective view of a printed circuit board that is used in the third embodiment.
Figure 23:
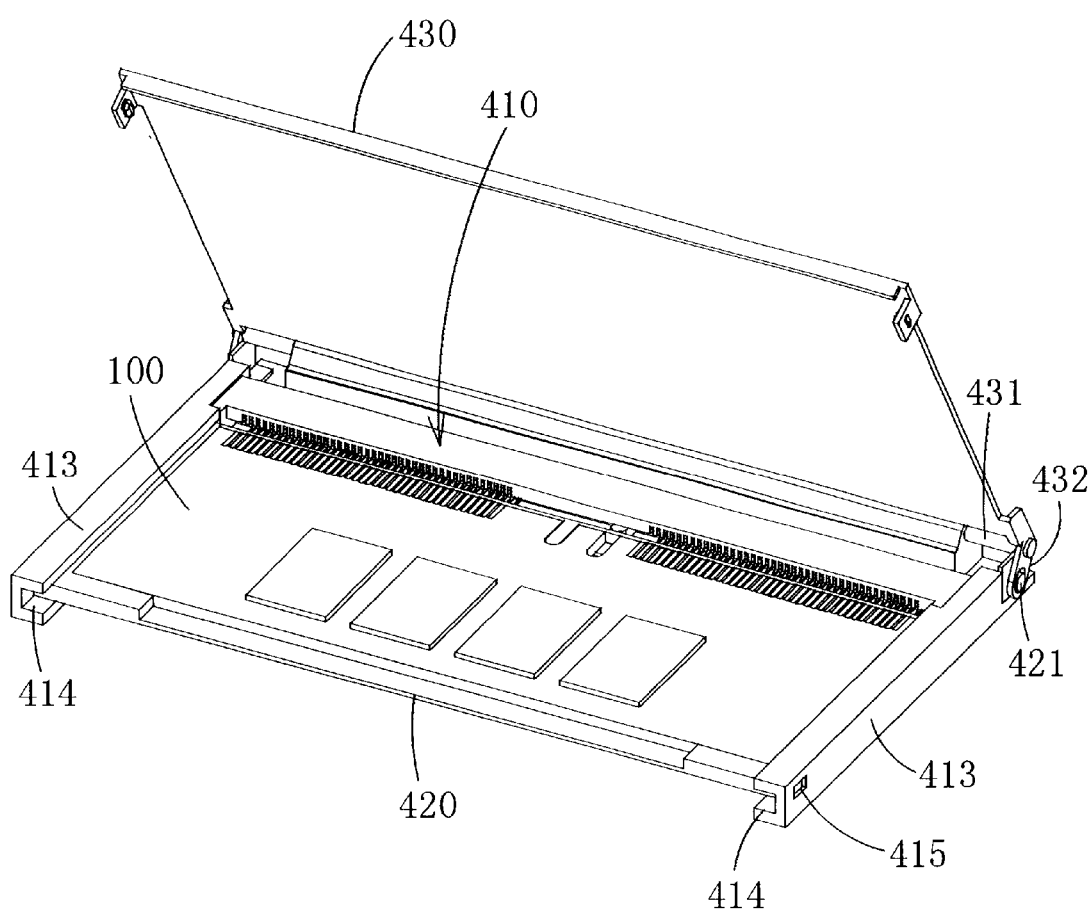
FIG. 23 is a perspective view showing the third embodiment of the connector in which the printed circuit board is fitted.
Figure 24:
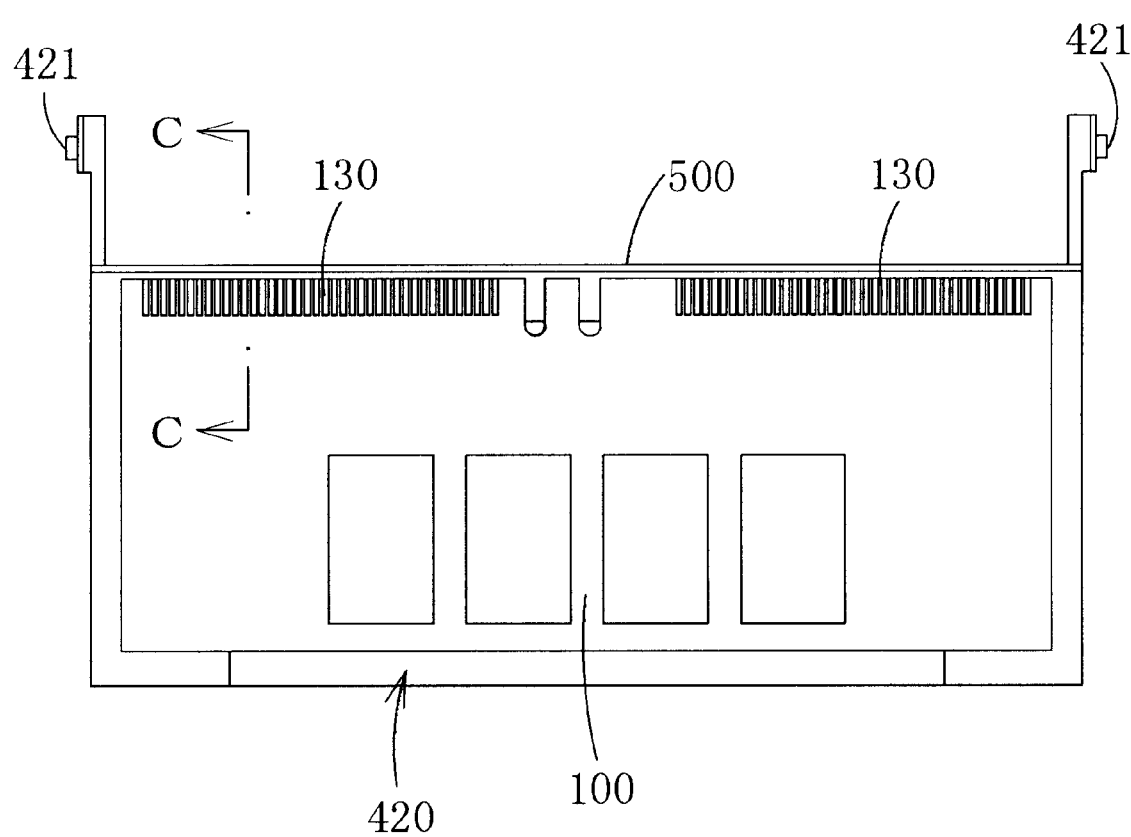
FIG. 24 is a plan view of the slider of the third embodiment of the connector carrying the printed circuit board.
Figure 25:
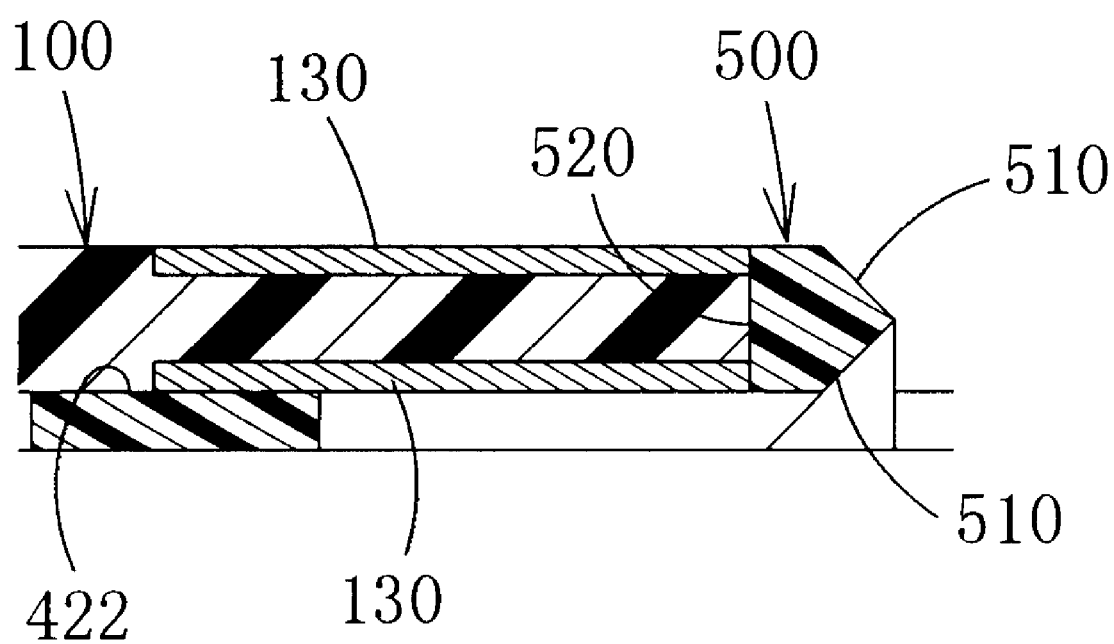
FIG. 25 is a sectional view along the line C—C of FIG. 24.
Figure 26:
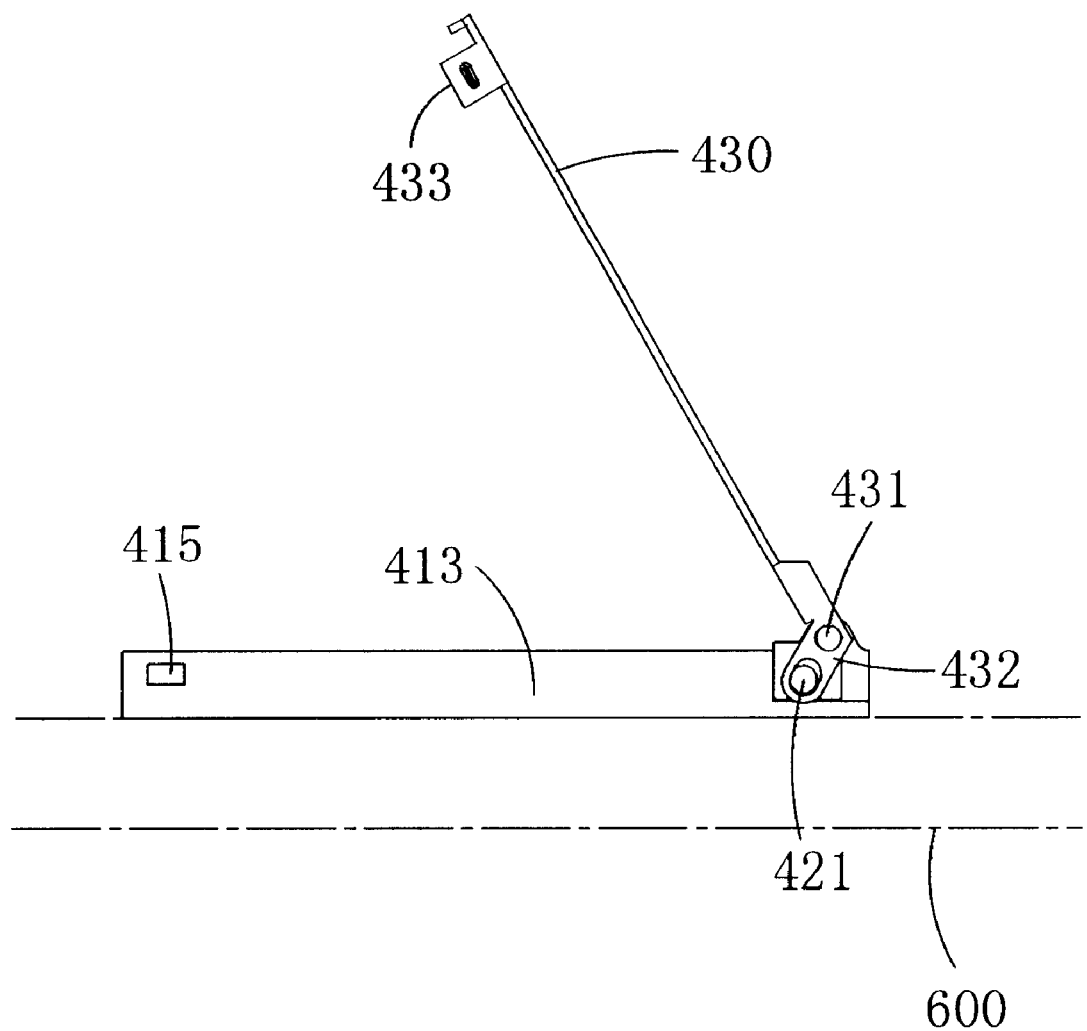
FIG. 26 is a side view of the slider of the third embodiment of the connector carrying the printed circuit board.

As shown in FIG. 20 and FIG. 21, a guide 500 that is made of an insulating material such as resin is provided at the front end of the slider 420. This guide 500 is provided in such a way that its rear end 520 is continuous to the front side 111 of the printed circuit board 100 being on the slider. In this embodiment, the guide 500 is provided on the recess 422 of the slider 420, the thickness t of the rear end 520 is formed to be identical to the thickness of the printed circuit board 100, and the rear end face of the guide 500 faces or in contact with the front of the printed circuit board 100. The guide 500 is formed into a wedge wherein the thickness t corresponding to the board thickness of the printed circuit board 100 gets thinner towards the front. This forms two slopes 510 that are tilted towards the front. This guide 500 is provided for a range wherein at least conductive pads 130 are present along the front side 111 of the printed circuit board 100 when the printed circuit board 100 is placed on the slider 420.

This third embodiment or connector for printed circuit board 400 is mounted on the counterpart board 600 by, for example, soldering the solder tails of the contacts 412a, 412b onto the counterpart board 600 and, if necessary, fixing the connector body 410 onto the counterpart board 600 by means of reinforcing tabs. To fit the printed circuit board 100 into the connector 400, the printed circuit board 100 is placed on the slider 420 when the rear end of the cover 430 is up (refer to FIG. 23 through FIG. 27B), then the rear end of the cover 430 is lowered. The slider 420 will move forward and the front side 111 of the printed circuit board 100 will be inserted into the contacts 412a, 412b. When the cover 430 is put over the printed circuit board 100 and engaged to the arms 413, the printed circuit board 100 will be sandwiched by the slider 420 and the cover 430 and held in the connection position (refer to FIG. 28 through FIG. 29B). In this case, positioning of the printed circuit board 100 in the top-bottom direction is made by the cover 430 and the slider 420, and positioning of the printed circuit board 100 in the front-rear and left-right directions is made by the inner sides of the recess 422; thus the printed circuit board 100 is kept in the connection position. When the printed circuit board 100 is to be disconnected from the connector 400, the cover 430 is raised. Then engagement to the connector body 410 will be undone, and the slider 420 will retreat to withdraw the printed circuit board 100 from the space between the contacts 412a, 412b.

Figure 29A:
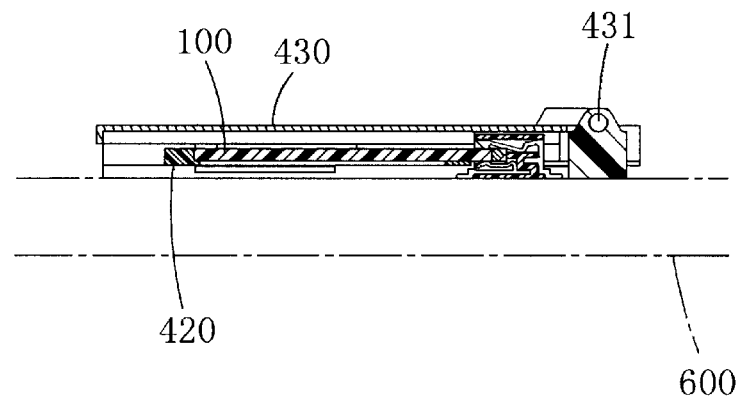
FIG. 29A is a vertical sectional view of the slider of the third embodiment of the connector carrying the printed circuit board with the rear end of the cover being down.
Figure 29B:
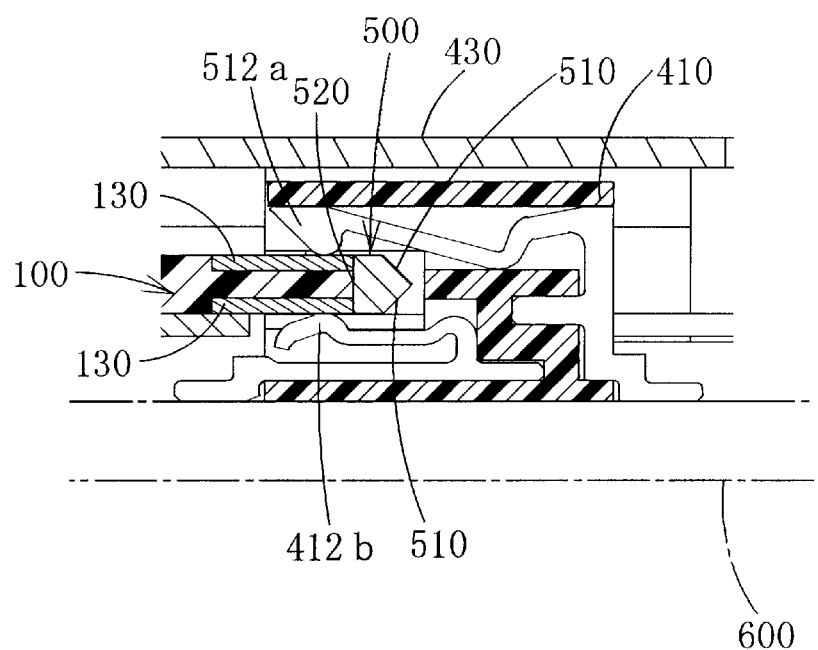
FIG. 29B is an enlarged view of a part thereof.

In this case, when the front side 111 of the printed circuit board 100 is inserted into the space between the contacts 412a, 412b, as shown in FIG. 27B and FIG. 29B, the contacting surfaces of the contacts 412a, 412b will be guided smoothly along the slopes 510 of the wedge-shaped guide 500 to the printed circuit board 100 to contact the conductive pads 130. Because of this, without reducing the contact force between the conductive pads 130 of the printed circuit board 100 and the contacts 412a, 412b, the insertion force of the printed circuit board 100 is reduced to improve the connection workability. Moreover, as damages or the like to the contacts 412a, 412b and the conductive pads 130 are eliminated to enhance the reliability of the connector 400. Similar effects may be obtained by chamfering the printed circuit board 100. Such chamfering, however, has drawbacks that the existing printed circuit boards can not be used directly, that beveling the edges of the front side of the printed circuit board 100 may cause peeling of the conductive pads 130 or scattering of the plated layers and, in turn, cause losses in terms of costs. In contrast to it, the connector 400 being the third embodiment does not pose any of such problems.

The present invention includes embodiments of a connector comprising only the connector body 410 of the third embodiment. However, like the third embodiment, when a plate-like cover is provided, of which front end is hinge-connected to the connector body 410 and which clamps the printed circuit board 100 with the slider 420, the retention structure sandwiches the printed circuit board 100 between the slider 420 and the cover 430. Hence even under the influence of thermal loads of the semiconductor chips 120, the retention force of the printed circuit board 100 will be hardly affected, and the connector can hold the printed circuit board 100 reliably. Moreover, as the connector 400 is free of any parts that are subjected to elastic deformation by manipulation, the connector 400 will be hardly damaged, thus the printed circuit board will be reliably held in the connection position. Thus defective connection and disconnection can be prevented.

The present invention includes embodiments wherein the cover and the slider are not connected with each other and the cover and the slider are moved independently of each other. However, when the cover 430 is connected to the slider 430 in such a way that if the rear end of the cover 430 is raised, the slider 420 will be retracted, raising and lowering of the rear end of the cover will generate a large moment, and as the slider 420 moves backward or forward according to this moment, the insertion force of the printed circuit board 100 is reduced and the connection workability is improved further.

The present invention covers printed circuit boards on which no semiconductor chips are mounted, and includes embodiments in which the cover is made of resin or any material. However, like the third embodiment, when the printed circuit board 100 is a board 110 on which semiconductor chips 120 are mounted and the cover 430 is made of a metal, even if the connector 400 is subjected to thermal loads of the semiconductor chips 120, as the thermal loads on the connector 400 are reduced by heat dissipation effect of the cover 430, the connector 400 will be hardly deformed. Furthermore, as the cover 430 covers the connector 400 and the printed circuit board 100, shied effect will be exhibited, and effects of electromagnetic waves, etc. on the printed circuit board 100 will be reduced, and the operation of the circuits will be stably maintained. When the connector body 410 is fixed onto the counter part 600 by means of metallic reinforcing tabs, it may be arranged so that when the cover 430 is engaged to the connector 410, the cover 430 will contact the reinforcing tabs and a circuit will be formed to ground the cover 430 via the reinforcing tabs. In this way, the performance of the shielding function of the cover 430 can be enhanced.

The present invention includes all embodiments that combine features of the above-mentioned embodiments.

With the description of these embodiments, the first cap for printed circuit board according to the present invention and the first low insertion force connector according to the present invention, which have been described in Summary above, have been fully disclosed. With the description of these embodiments, a second cap for printed circuit board, and a second and third low insertion force connectors according to the present invention, which will be described below, have been fully substantiated.

A second cap according to the first cap wherein, the cap is fitted to the connector so that the cap can advance towards and retreat from the contact of the connector. With this arrangement, when the front side of the printed circuit board is put into the cap being fitted to the connector and the printed circuit board is pushed in, the cap and the printed circuit board will be inserted into the contact, and when the printed circuit board is pulled out, the cap and the printed circuit board will be withdrawn from the contact. When the printed circuit board is pulled further, the printed circuit board will come off the cap. Thus insertion and withdrawal of the printed circuit board can be done with ease.

A second low insertion force connector according to the first low insertion force connector, further comprising a plate-like cover, of which front end is hinge-connected to the connector body, which sandwiches the printed circuit board between itself and the slider, and which is connected to the slider so that when the rear end of the cover is raised, the slider will retreat. With this arrangement, as the retention structure is one in which the printed circuit board is sandwiched between the slider and the cover, even when the connector is subjected to thermal loads of the semiconductor chips, the retention force for the printed circuit board will be hardly affected, and the connector can retain the printed circuit board reliably. As the connector has no parts that are to undergo elastic deformation by manipulation, the connector will be free of damages, and the printed circuit board can be reliably held in the connection position. Accordingly, defective connection and disconnection of the printed circuit board can be prevented. As lifting and lowering of the rear end of the cover generates a large moment and the slider is retreated or advanced according to this moment, the insertion force of the printed circuit board is reduced and the connection workability can be enhanced further.

A third low insertion force connector according to the second low insertion force connector wherein, a semiconductor chip is mounted on the board of the printed circuit board to be connected and the cover is metallic. With this arrangement, even if the connector is subjected to thermal loads of the semiconductor chip, the thermal loads on the connector will be reduced by heat-dissipating action of the metallic cover, thus the connector can be prevented from being deformed. Moreover, as the metallic cover covers the connector and the printed circuit board, the cover exhibits shielding function, and effects of electromagnetic waves or the like on the connector and the printed circuit board will be reduced. Thus the operation of the circuit can be maintained stably.

What is claimed is:

1. A cap that is to be fitted onto a printed circuit board that has a conductive pad on the front side of a rectangular board and is to be connected to a connector, said cup comprising:
    a bag having upper, lower, side and frontal surfaces that can be put over the frontal side of the printed circuit board and being formed into a wedge so that the thickness of said frontal surface corresponding to the direction of board thickness of the printed circuit board is reduced towards the front, and
    at least one guide pin extending from said side surface of said bag for positioning the printed circuit board with respect to the connector.

2. A cap for printed circuit board according to claim 1, further comprising a second guide pin extending from a second side surface of the cap.

3. A cap for printed circuit board according to claim 1, further comprising at least one opening formed in at least said upper surface and said frontal surface of said bag.

4. A cap for printed circuit board according to claim 3, wherein a plurality of openings are formed in said upper and frontal surfaces of said bag.

5. A cap for printed circuit board according to claim 3, further comprising at least one opening formed in said lower surface and said frontal surface of said bag.

6. A cap for printed circuit board according to claim 5, wherein a plurality of openings are formed said lower and frontal surfaces of said bag.

7. A cap for printed circuit board according to claim 6, wherein a plurality of openings are formed in said upper and frontal surfaces of said bag.

8. A cap for printed circuit board according to claim 5, wherein a thickness of said frontal surface of the cap between said openings formed in said frontal surface is substantially equal to a thickness of the printed circuit board.

* * * * *